(12) United States Patent
Lunsman et al.

(10) Patent No.: US 12,439,564 B2
(45) Date of Patent: Oct. 7, 2025

(54) LEVER ACTUATED COLD PLATE

(71) Applicant: HEWLETT PACKARD ENTERPRISE DEVELOPMENT LP, Spring, TX (US)

(72) Inventors: Harvey J. Lunsman, Chippewa Falls, WI (US); Michael Scott, Chippewa Falls, WI (US); Steven Dean, Chippewa Falls, WI (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 217 days.

(21) Appl. No.: 18/362,358

(22) Filed: Jul. 31, 2023

(65) Prior Publication Data

US 2025/0048595 A1    Feb. 6, 2025

(51) Int. Cl.
| | | |
|---|---|---|
| H05K 7/20 | (2006.01) | |
| H01L 23/40 | (2006.01) | |
| G02B 6/42 | (2006.01) | |
| H04B 1/036 | (2006.01) | |

(52) U.S. Cl.
CPC ....... *H05K 7/2049* (2013.01); *H05K 7/20254* (2013.01); *G02B 6/4268* (2013.01); *H01L 23/40* (2013.01); *H01L 2023/4081* (2013.01); *H01L 2023/4087* (2013.01); *H04B 1/036* (2013.01)

(58) Field of Classification Search
CPC .. H05K 7/20254; H05K 7/2049; H01L 23/40; H01L 23/473; H01L 2023/4075–4087; G02B 6/4266–4273; H04B 1/036
See application file for complete search history.

(56) References Cited

U.S. PATENT DOCUMENTS

| | | | | |
|---|---|---|---|---|
| 10,117,357 B2* | 10/2018 | Bai | ................ | H05K 7/20536 |
| 10,955,883 B1* | 3/2021 | Franz | ................ | G06F 1/26 |
| 2009/0229808 A1* | 9/2009 | Chu | ................ | H05K 7/2049 |
| | | | | 165/185 |
| 2011/0013359 A1 | 1/2011 | Goldrian et al. | | |
| 2021/0109574 A1 | 4/2021 | Franz et al. | | |
| 2022/0052474 A1* | 2/2022 | Chiu | ................ | G02B 6/4261 |
| 2023/0034486 A1 | 2/2023 | Scott | | |

OTHER PUBLICATIONS

Extended European Search Report and Search Opinion received for EP Application No. 24186901.5, mailed on Dec. 23, 2024, 11 pages.

* cited by examiner

*Primary Examiner* — Zachary Pape
(74) *Attorney, Agent, or Firm* — Hewlett Packard Enterprise Patent Department

(57) ABSTRACT

Cooling module includes a mounting element, a force application member, a lever, and a cold plate movably coupled to the mounting element. The mounting element having engagement members, is coupled to a receptacle of an electronic device that is configured to receive a removable electronic device at the receptacle. The force application member having spring fingers, is disposed between the mounting element and the cold plate, and movable relative to the mounting element. The lever is connected to the mounting element and the force application member and shiftable between actuated and unactuated states. In the actuated state, the lever pushes the force application member along a first direction causing the engagement members to move the force application member along a second direction perpendicular to the first direction and urge the cold plate to compress the spring fingers and establish thermal contact between the cold plate and the removable electronic module.

20 Claims, 18 Drawing Sheets

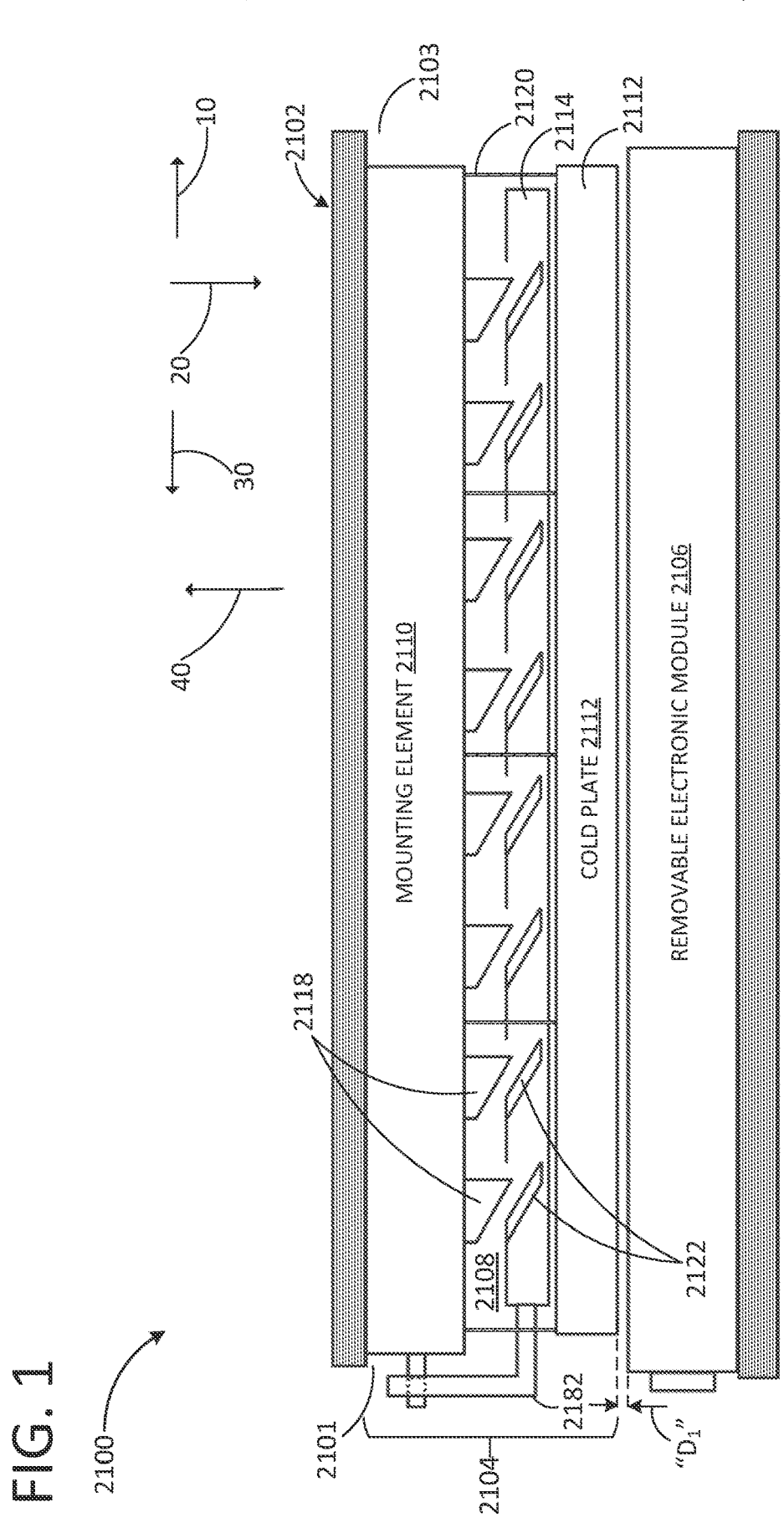

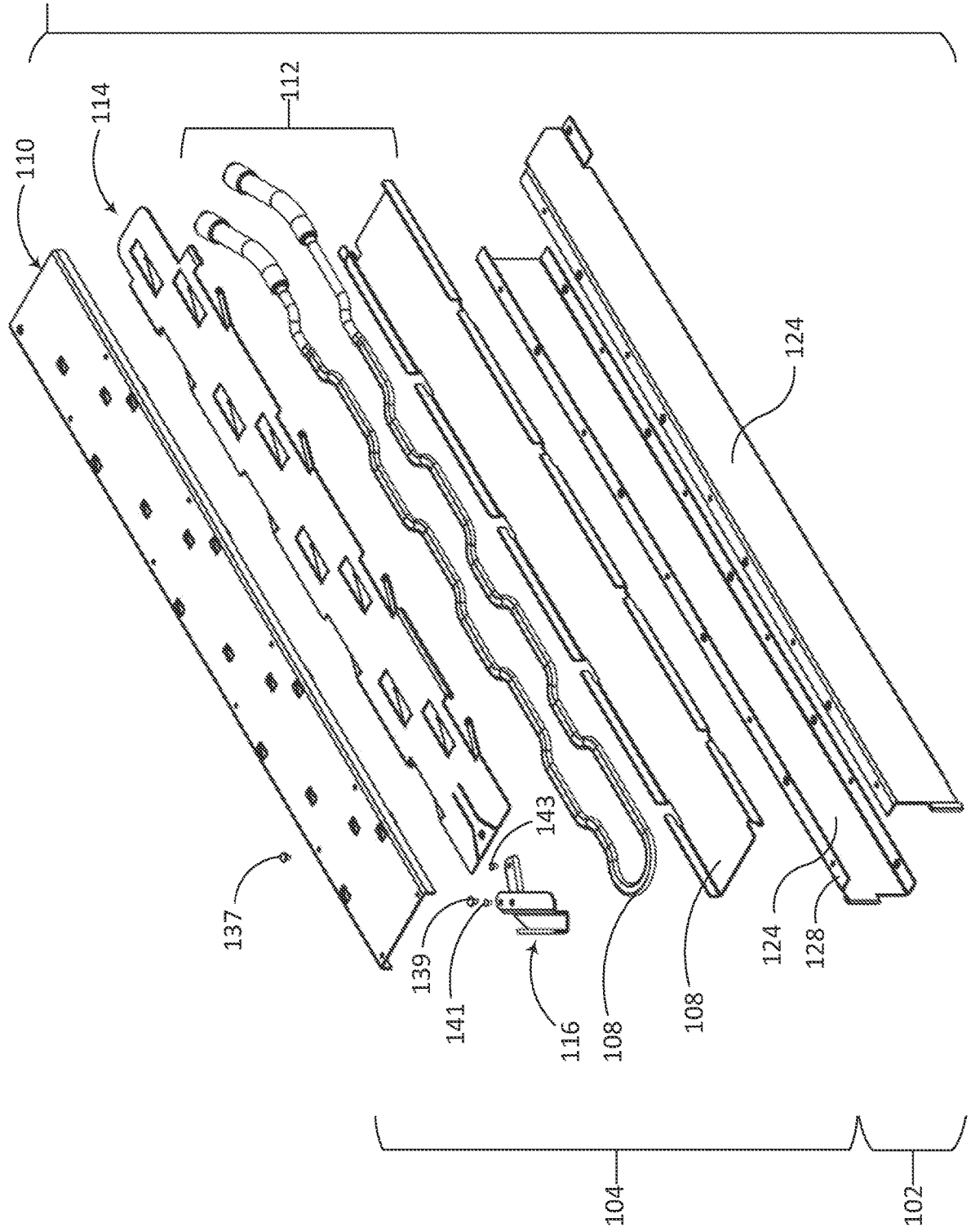

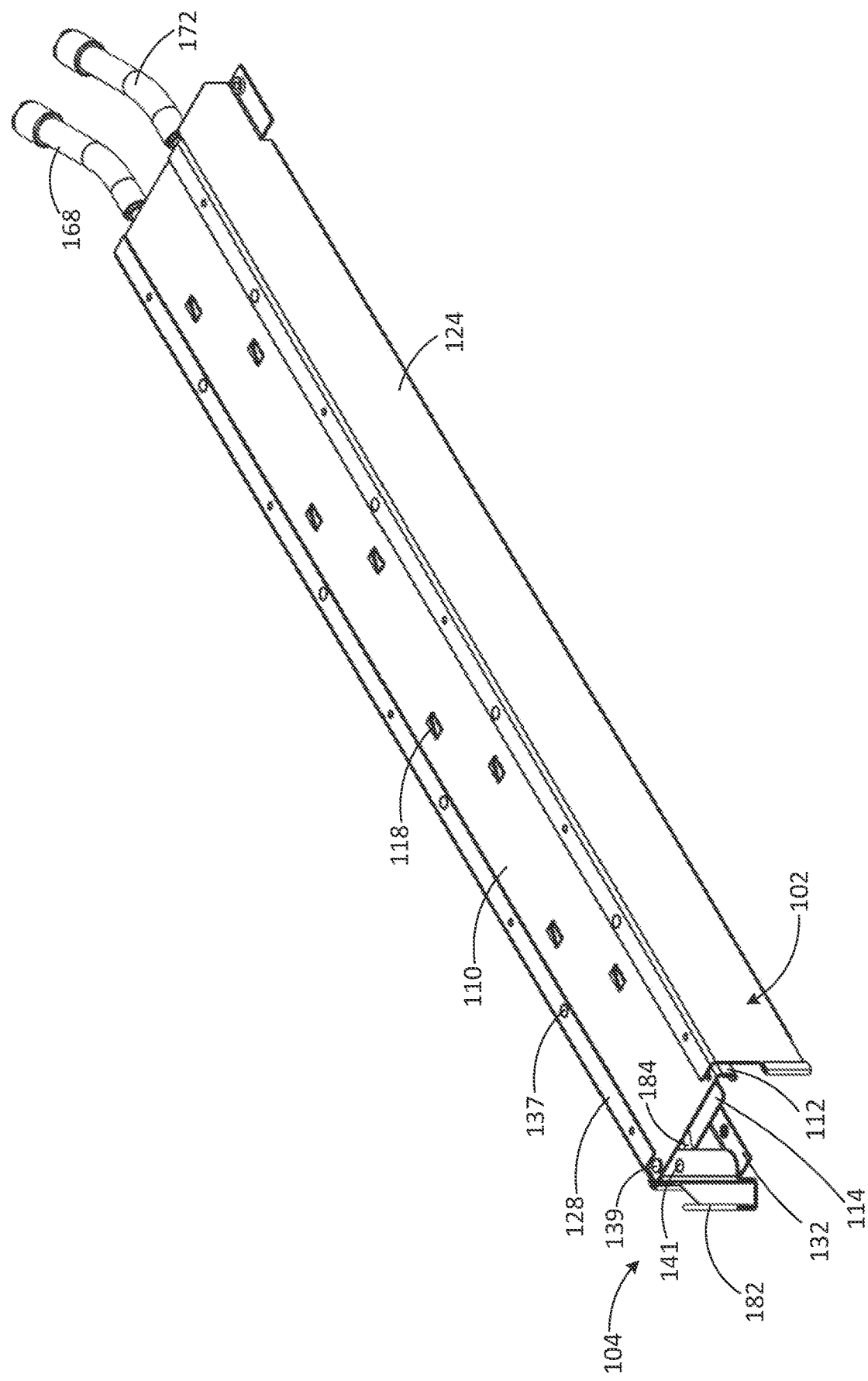

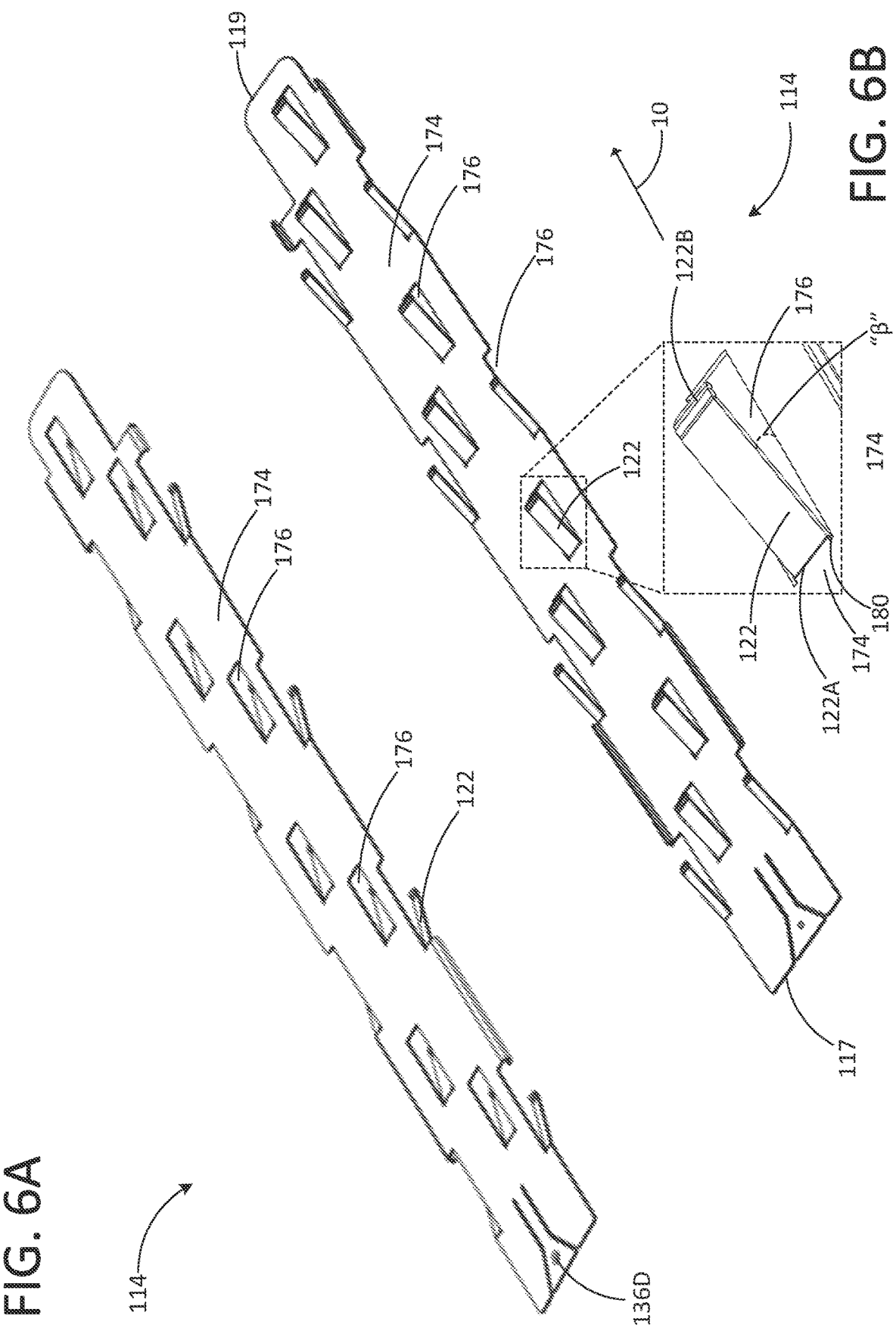

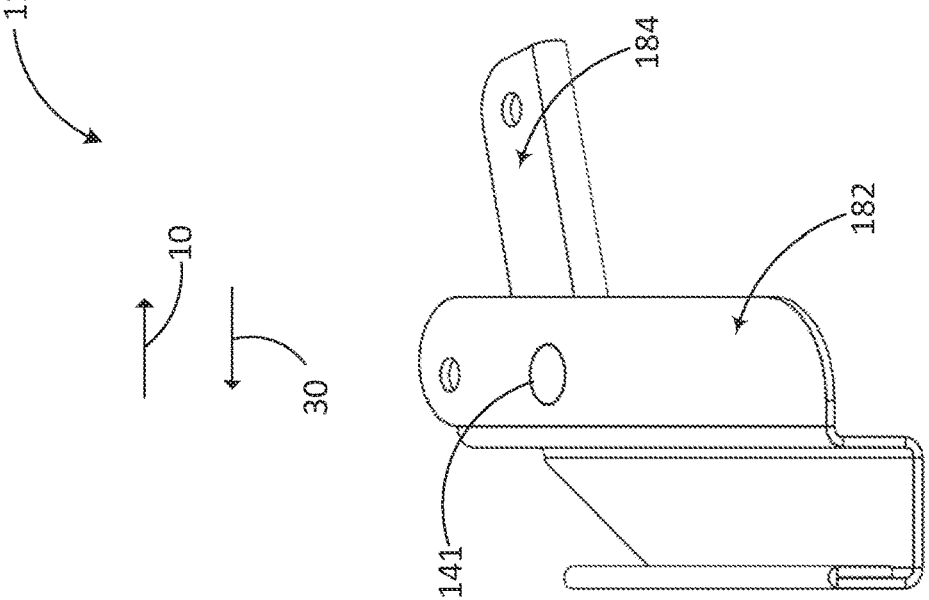
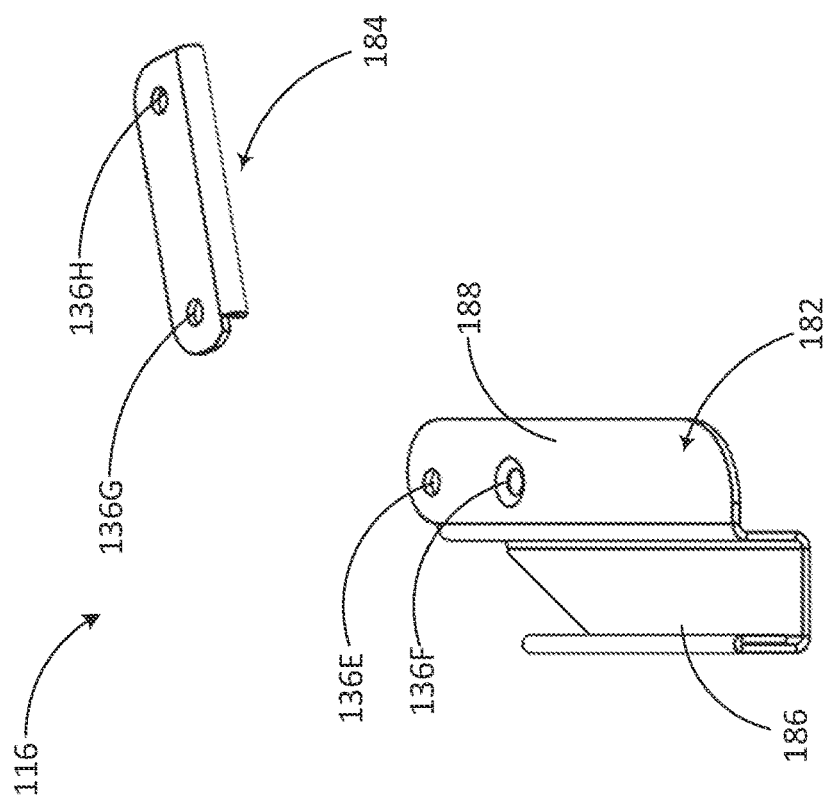

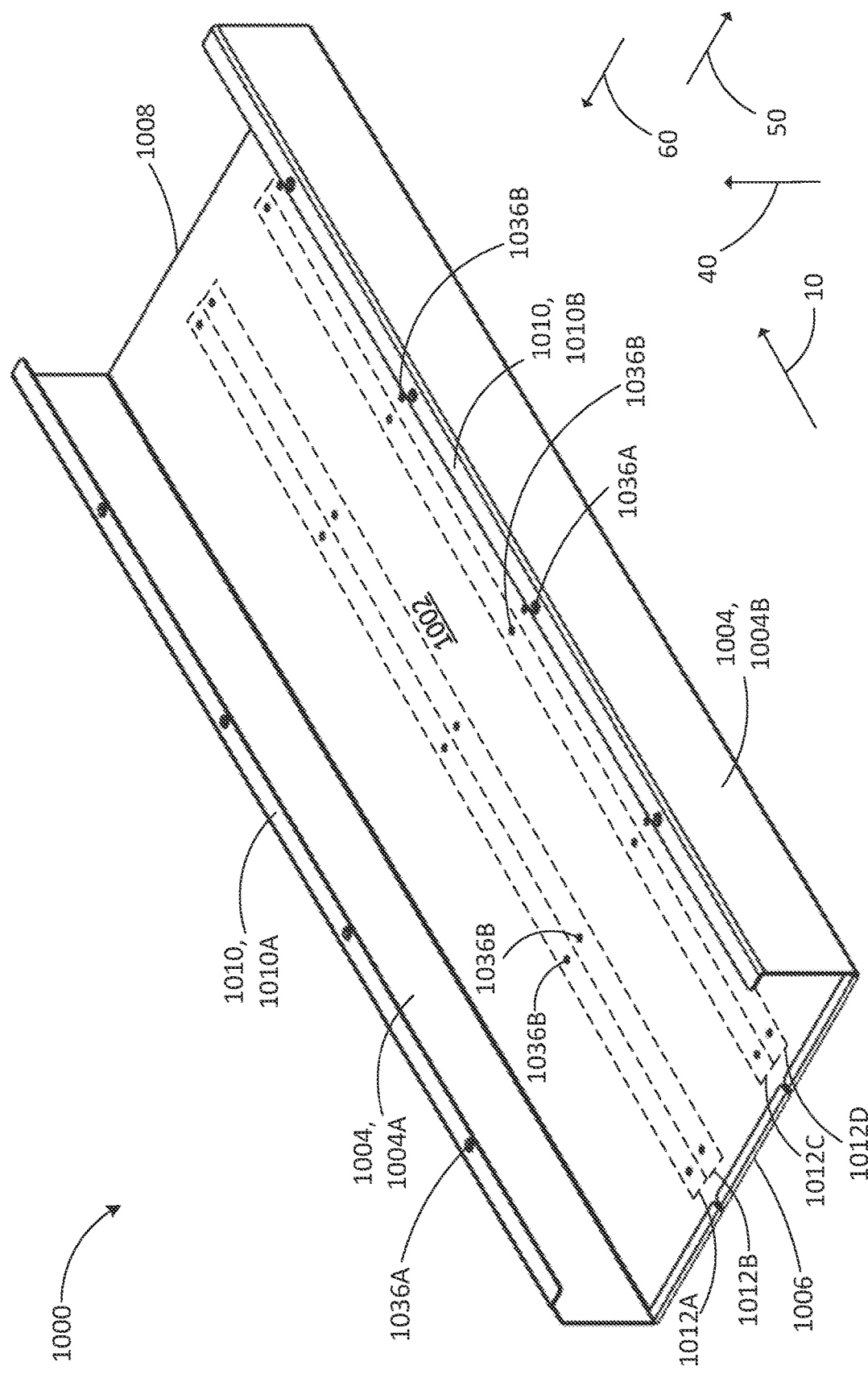

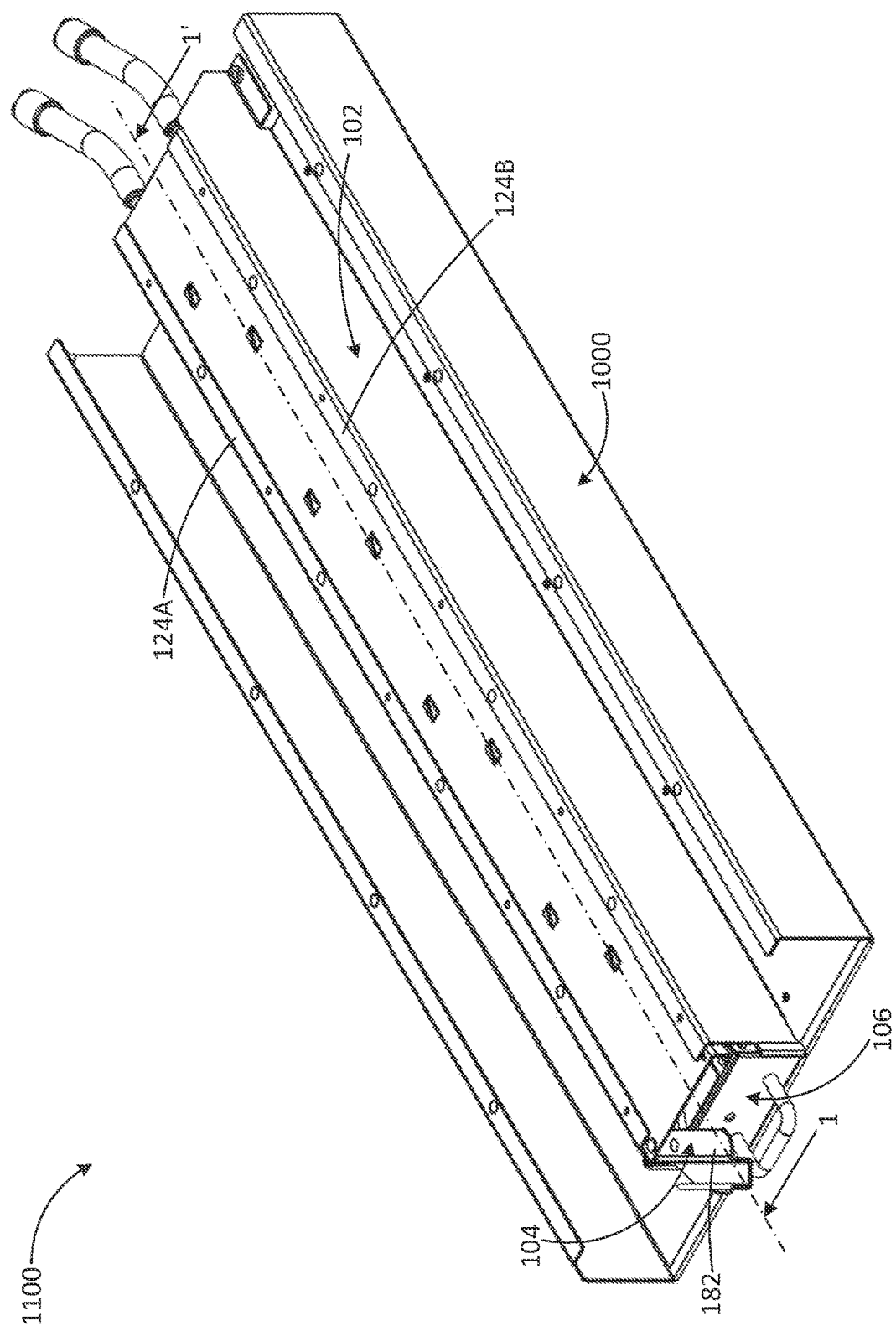

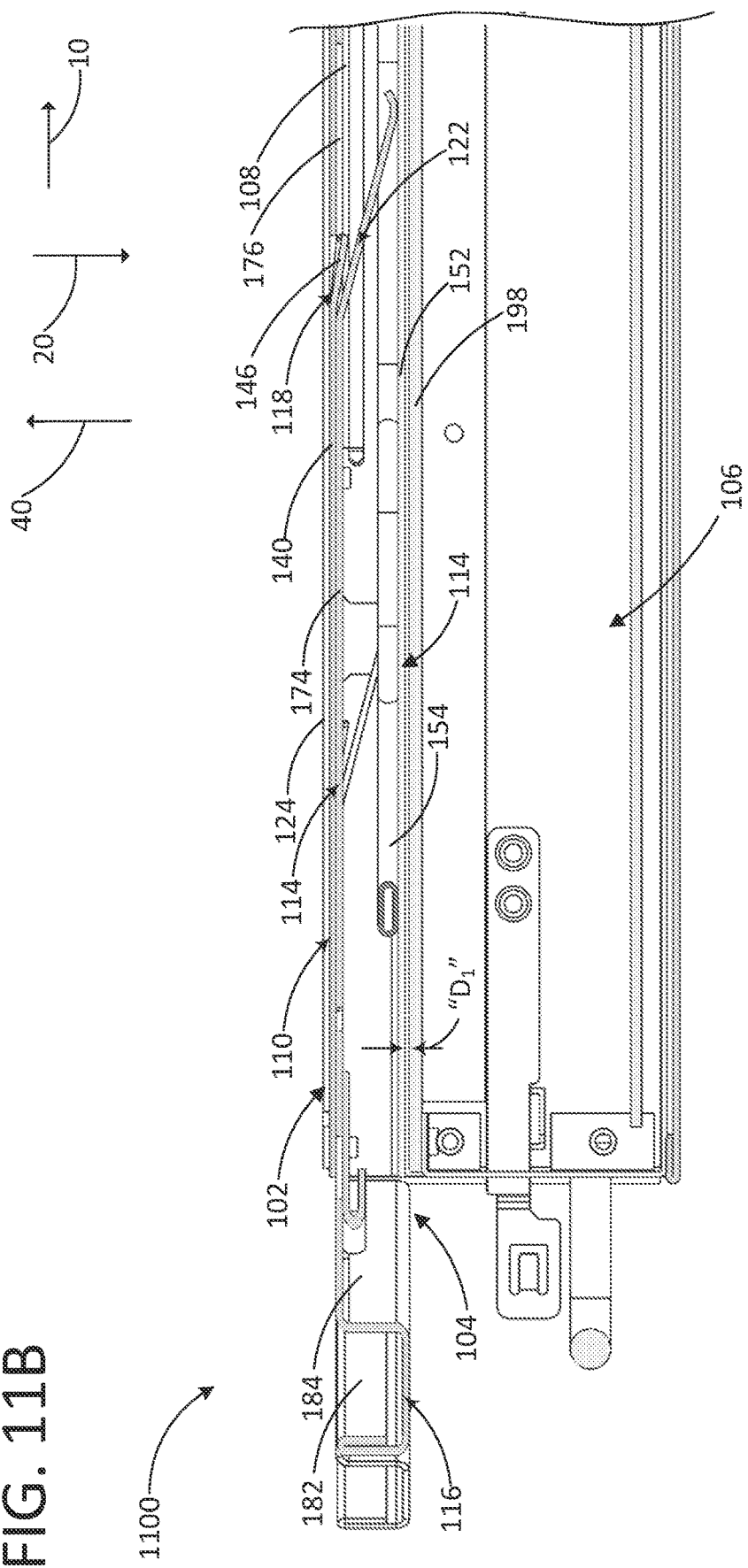

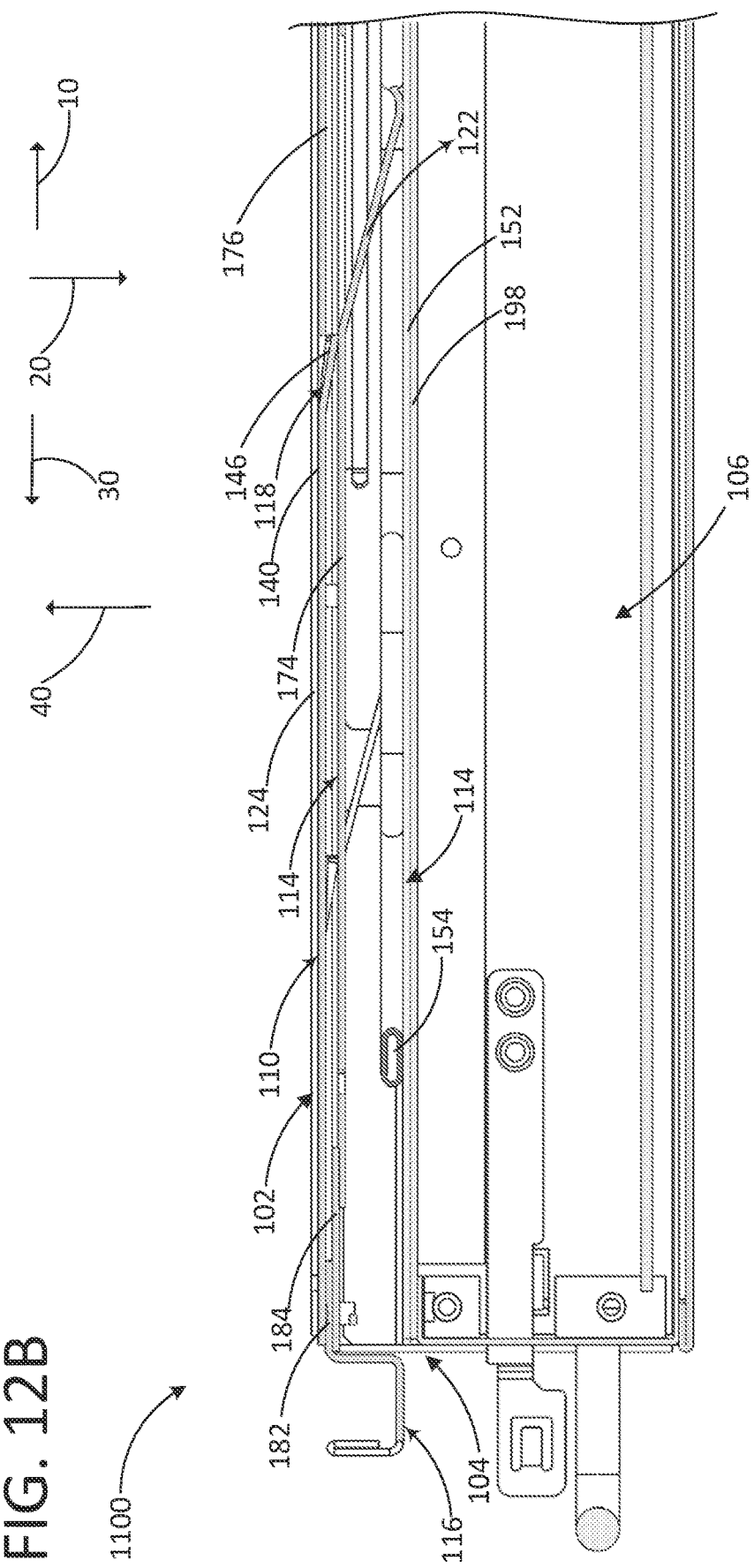

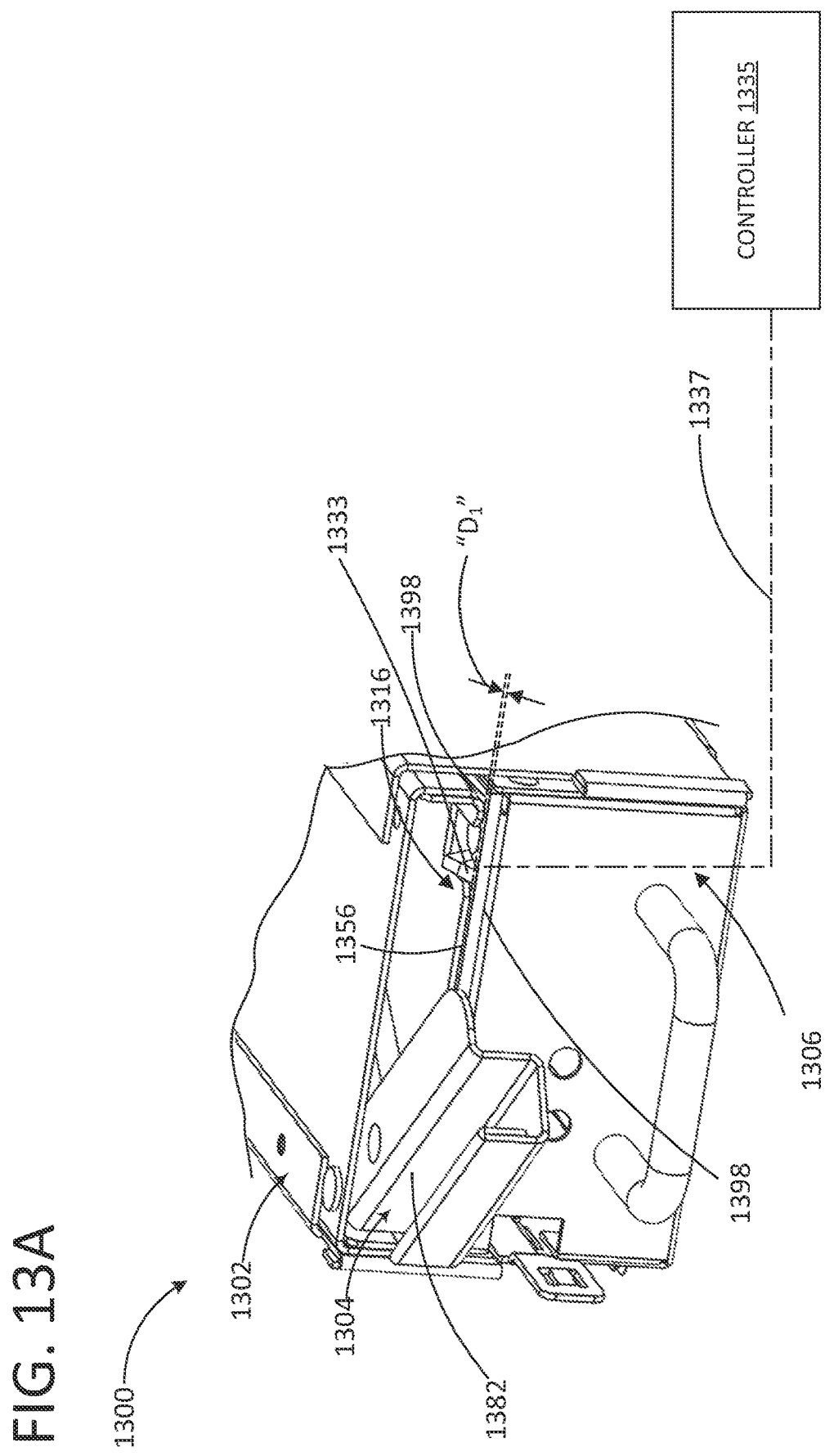

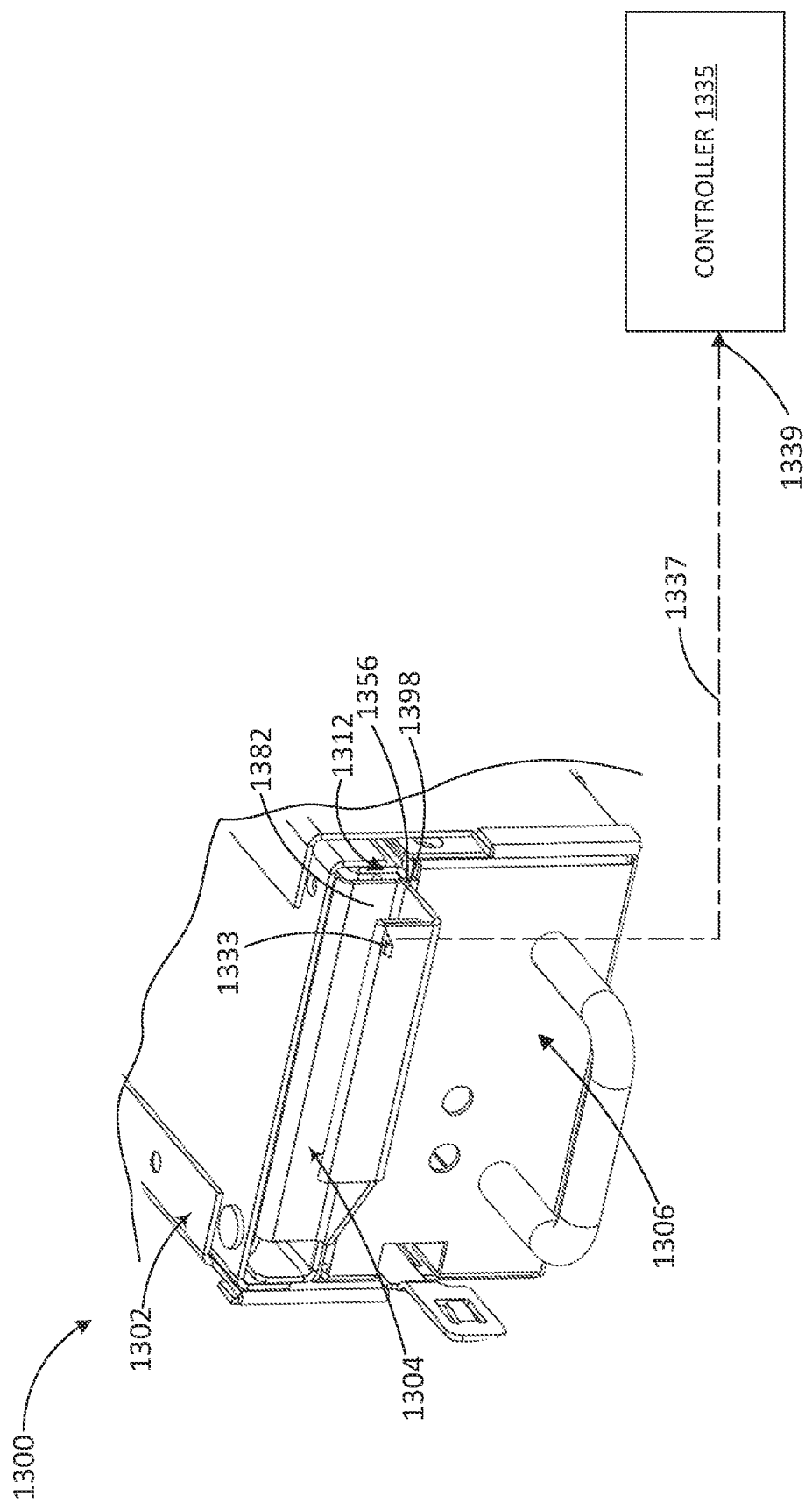

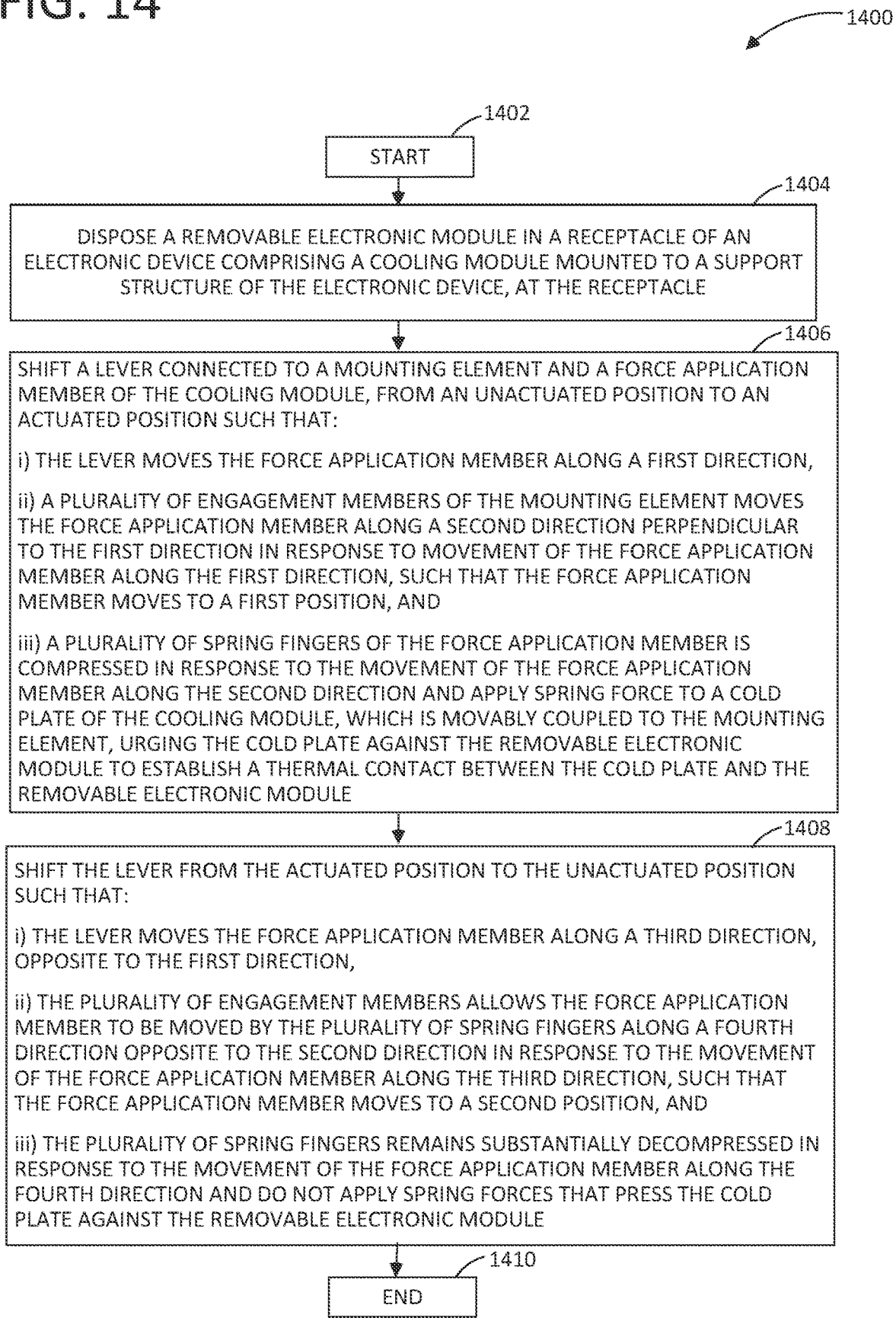

LEVER ACTUATED COLD PLATE

BACKGROUND

A removable electronic module, such as a power supply unit, a small form-factor removable (SFP) transceiver, a non-volatile memory express (NVMe) storage, or the like may be connected to an electronic device, such as a server whenever required for performing their respective functions. Further, such removable electronic modules may generate heat, while performing their respective functions. If adequate amount of the heat is not removed from the removable electronic module, it may exceed thermal specifications of the removable electronic module, and thereby degrade the performance, reliability, and/or life expectancy of the removable electronic module and may also cause its failure. Thus, the electronic device may be configured to provide cooling to regulate heat generated by the removable electronic module.

BRIEF DESCRIPTION OF THE DRAWINGS

Various examples will be described below with reference to the following figures.

FIG. 1 illustrates a block diagram of an electronic device having a support structure, a cooling module, and a removable electronic module according to an example of the present disclosure.

FIG. 2A illustrates an exploded perspective view of another example cooling module and support structure according to an example of the present disclosure.

FIG. 2B illustrates an assembled perspective view of the cooling module in the support structure of FIG. 2A according to an example of the present disclosure.

FIG. 6A illustrates an enlarged perspective top view of a force application member of the cooling module of FIGS. 2A-2B according to an example of the present disclosure.

FIG. 6B illustrates an enlarged perspective bottom view of the force application member of the cooling module of FIG. 6A according to an example of the present disclosure.

FIG. 7A illustrates an enlarged exploded perspective view of a lever assembly of the cooling module of FIGS. 2A-2B according to an example of the present disclosure.

FIG. 7B illustrates an enlarged assembled perspective view of the lever assembly of FIG. 7A according to an example of the present disclosure.

FIG. 10 illustrates a perspective view of a casing of an electronic device according to an example of the present disclosure.

FIG. 11A illustrates a perspective view of an electronic device having the casing of FIG. 10 and the removable electronic module of FIG. 8 disposed in an assembly of the cooling module in the support structure of FIG. 2B in an unactuated state, according to an example of the present disclosure.

FIG. 11B illustrates a cross-sectional view of a portion of the electronic device of FIG. 11A taken along line 1-1' according to an example of the present disclosure.

FIG. 12B illustrates a cross-sectional view of a portion of the electronic device of FIG. 12A taken along line 2A-2A' according to an example of the present disclosure.

FIG. 13A illustrates a perspective view of a portion of an electronic device having a controller, a support structure, a cooling module, and a removable electronic module having a mechanical switch in an open position according to an example of the present disclosure.

FIG. 13B illustrates a perspective view of the portion of the electronic device of FIG. 13A having the controller, the support structure, the cooling module, and the removable electronic module having the mechanical switch in a closed position according to an example of the present disclosure.

FIG. 14 is a flowchart depicting a method of thermally coupling a cooling module to a removable electronic module according to one example of the present disclosure.

DETAILED DESCRIPTION

Figure 3:
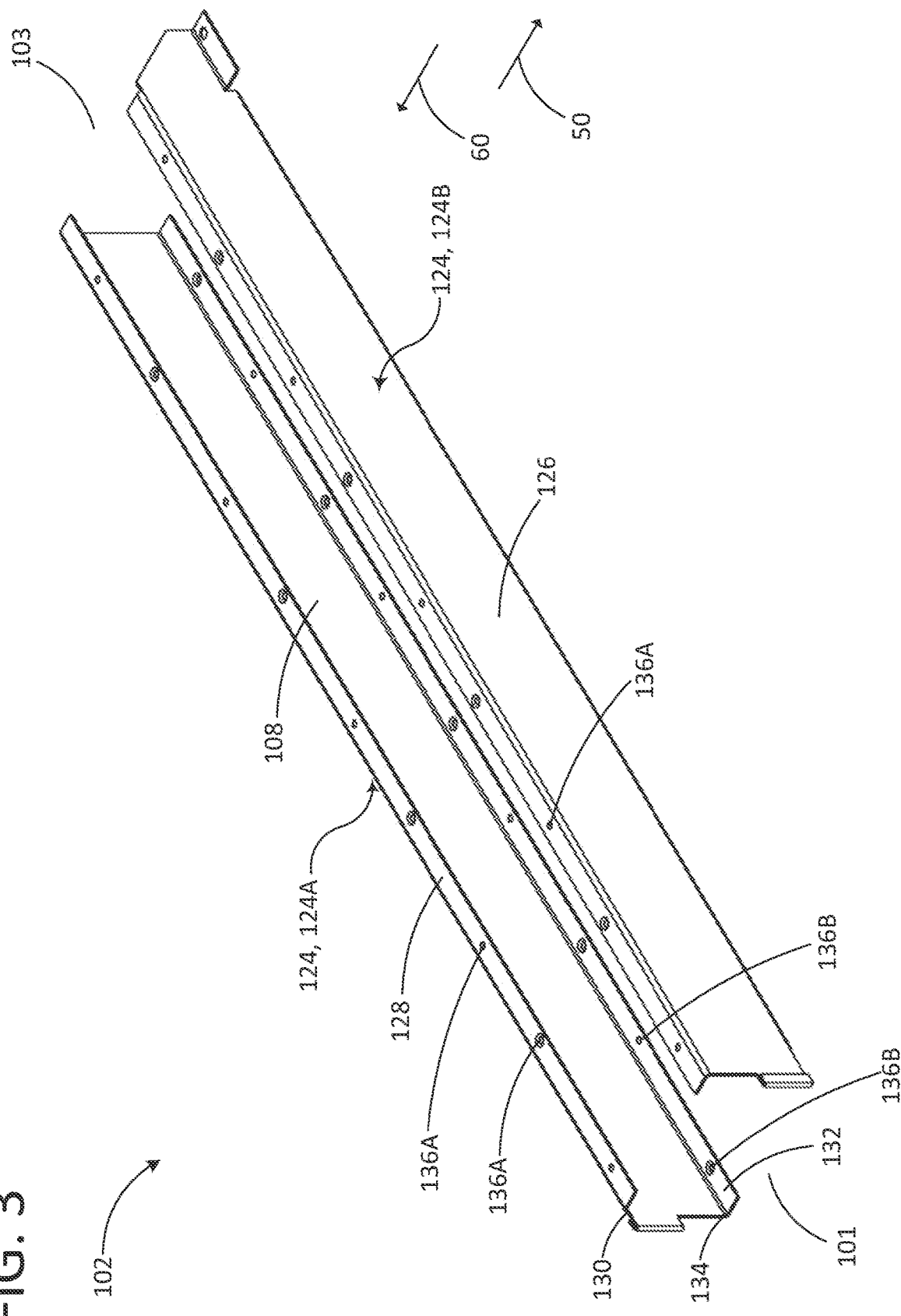
FIG. 3 illustrates an enlarged perspective view of the support structure of FIGS. 2A-2B according to an example of the present disclosure.
Figure 4:
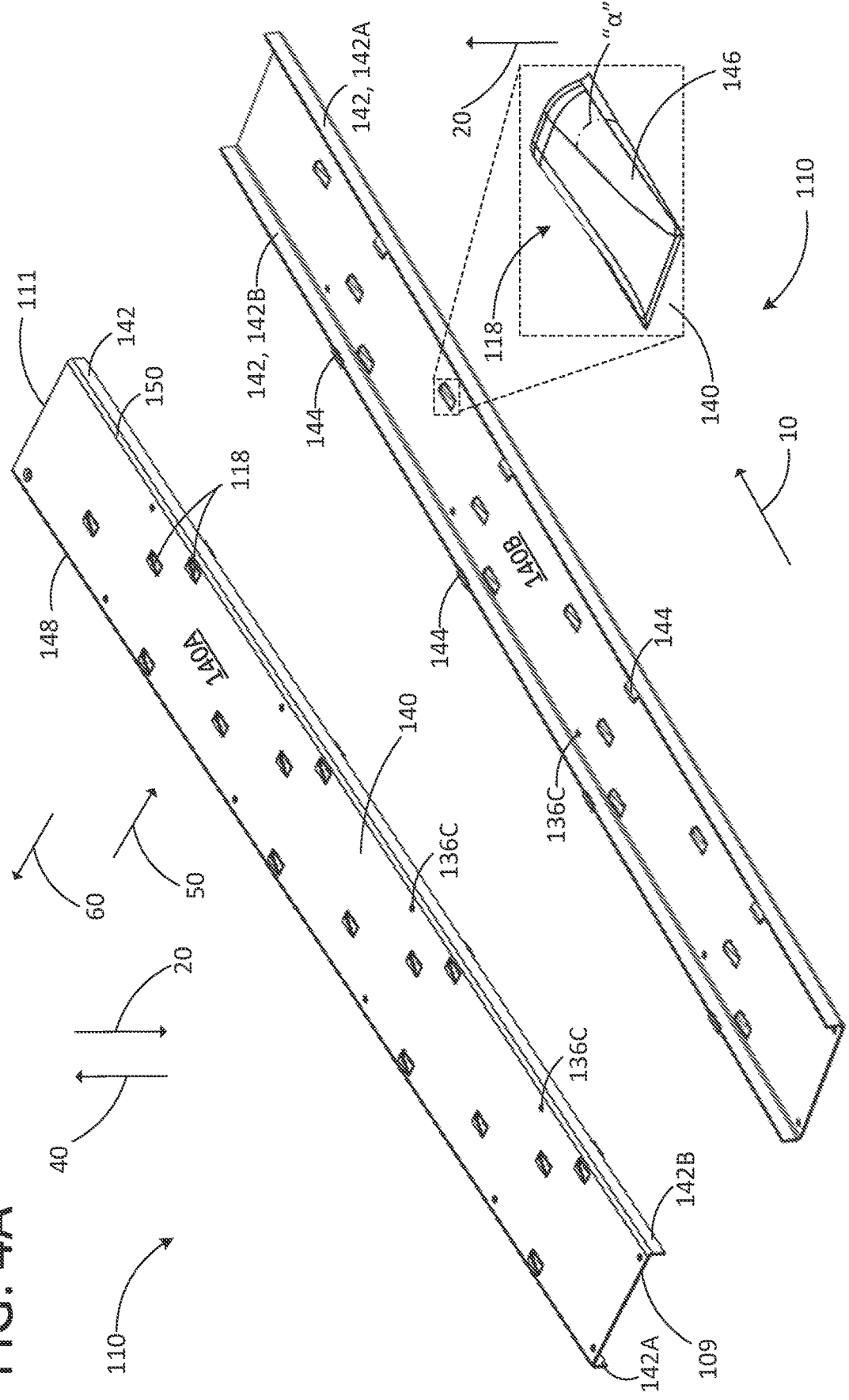
FIG. 4A illustrates an enlarged perspective top view of a mounting element of the cooling module of FIGS. 2A-2B according to an example of the present disclosure.
FIG. 4B illustrates an enlarged perspective bottom view of the mounting element of the cooling module of FIG. 4A according to an example of the present disclosure.

The following detailed description refers to the accompanying drawings. For purposes of explanation, certain examples are described with reference to the components illustrated in FIGS. 1-14. The functionality of the illustrated components may overlap, however, and may be present in a fewer or greater number of elements and components. Moreover, the disclosed examples may be implemented in various environments and are not limited to the illustrated examples. Wherever possible, the same reference numbers are used in the drawings and the following description to refer to the same or similar parts. It is to be expressly understood, however, that the drawings are for the purpose of illustration and description only. While several examples are described in this document, modifications, adaptations, and other implementations are possible. Accordingly, the following detailed description does not limit the disclosed examples. Instead, the proper scope of the disclosed examples may be defined by the appended claims.

An electronic device may include a cold plate to remove heat from a removable electronic module. In such examples, when the removable electronic module is connected to the electronic device, the cold plate may establish a thermal contact with the removable electronic module and enable transfer of heat from the removable electronic module to the cold plate, from which the heat is then transferred to a cooling medium of the system (e.g., liquid coolant in a coolant loop coupled to the cold plate). However, establishing good thermal contact between the cold plate and the removable electronic module (i.e., between two interfacing surfaces) may be difficult, particularly due to the removable nature of the removable electronic module.

Good thermal contact (i.e., contact which results in high thermal conductivity across the contact interface) depends on various factors, which include the flatness/smoothness of the surfaces, the alignment of the surfaces (e.g., how close to parallel the surfaces are), and the pressure with which the surfaces are pressed against one another. In some cases, applying contact pressure can correct or offset the negative effects of imperfections in surface flatness/smoothness and/or alignment. For example, applying sufficient contact pressure can force two interfacing surfaces, which may have been initially misaligned, into alignment. As another example, if imperfections in surface flatness/smoothness reduce the thermal conductivity below desired levels, applying contact pressure can increase the thermal conductivity and offset the reduction due to surface imperfections. Another approach to counteracting the negative effects of imperfections in surface flatness/smoothness and/or alignment is to use a thermal interfacing material (TIM), such as a thermal gap pad, a thermal grease, a thermal foam, or the like, which is placed in-between the interfacing surfaces. The TIM is generally a compliant material which can conform to the two interfacing surfaces notwithstanding their surface imperfections and/or misalignment, and thus improve the overall thermal conductivity of the interface.

However, in the context of certain removable electronic modules, the two approaches to improving thermal contact mentioned above i.e., applying high contact pressure, and using a TIM, can be difficult or even infeasible in some cases. Often, the removable electronic module is installed in and removed from a larger electronic device by sliding the removable electronic module into or out of a receptacle along a direction parallel to the interfacing surface of the removable electronic module, and as the removable electronic module is inserted into or removed from the receptacle, the interfacing surface may contact and slide against the cold plate of the larger electronic device. However, the sliding contact between the interfacing surfaces can create friction forces that resist the insertion/removal of the removable electronic module, and these friction forces become larger as the contact pressure is increased and/or as the size (area) of the interfacing surfaces is increased. Thus, in systems which attempt to improve thermal contact by applying greater pressure, this may also result in making insertion or removal of the removable electronic module difficult, and in some cases the combination of a large surface area and a large contact pressure can result in excessively large insertion/removal forces being needed. For example, some removable electronic module, such as power supply units (PSUs) have been determined to require up to 0.08 pound force for insertion and/or removal, and this level of force may be deemed, in some circumstances, too much for an average person to comfortably or safely apply on a repetitive basis (e.g., if multiple modules are being inserted/removed in series).

In addition, if a TIM is used, then the sliding contact between the interfacing surfaces can result in damage and/or displacement of the TIM. For example, if the TIM is a gap pad or similar type of material which may be mounted to the cold plate for establishing thermal contact with the removable electronic module, the TIM may get rubbed by the removable electronic module, thereby damaging (e.g., tearing, abrading, etc.), or displacing the TIM, especially when the TIM is small and/or fragile in nature. Additionally, repetitive connecting and/or disconnecting of the removable electronic module may result in peeling out of the TIM over a period. Similarly, if the TIM is a thermal grease or paste, repetitive connecting and/or disconnecting of the removable electronic module may cause the TIM to be easily scraped off from the cold plate. Further, the cold plate having a TIM may be directly exposed to an external environment when the removable electronic module is not connected to the electronic device, or when a receptacle of the electronic device is left empty, or when the electronic device is not in use. This may result in accumulation of foreign objects, debris, or the like, on the TIM, thereby damaging the TIM.

A technical solution to the aforementioned problems includes providing a cooling module within a receptacle of an electronic device into which a removable electronic module can be installed, where the cooling module includes a cold plate which is movable towards and away from the removable electronic module by a lever. Moreover, the cooling module may apply a biasing force to the cold plate to urge the cold plate towards the removable electronic module, and the cooling module can be changed between two states by actuation of the lever: in a first state (e.g., unactuated state), a little or no biasing force is applied to the cold plate and thus there is little to no contact pressure between the cold plate and the removable module (assuming the removable module is inside the receptacle); in a second state (e.g., an actuated state), a relatively larger biasing force is applied to the cold plate and the cold plate is pressed against the removable electronic module resulting in a relatively large contact pressure being applied therebetween. The cooling module may be placed in the first state during insertion or removal of the removable electronic module into and out of the electronic device (i.e., in an uninstalled position of the removable electronic device) to reduce the amount of friction generated during such movement of the removable electronic module into and out of the electronic device. On the other hand, when the removable electronic module is in an installed position, the cooling module may be placed in the second state to obtain good thermal contact between the cold plate and the interface surface of the removable electronic module due to the relatively larger contact pressure being applied between the cold plate and removable module. In some cases, the cooling module may include a mounting element coupled to a support structure of the electronic device. The mounting element may mount the cooling module to the electronic device and physically support the other components of the cooling module. The cold plate may be movably coupled to the mounting element such that the cold plate can move toward or away from the removable module (e.g., up, or down). The cooling module may further include a force application member disposed between the mounting element and the cold plate, where the force application member is movable relative to the mounting element. The force application member is configured to apply the biasing force to the cold plate and is movable relative to the mounting element between a first position in which no or little biasing force is applied and a second position in which a relatively larger biasing force is applied. The first position of the force application member corresponds to the first state of the cooling module, and the second position of the force application member corresponds to the second state of the cooling module.

In some examples, the force application member may include a plurality of spring fingers which engage with the cold plate, with the spring finger generating the biasing force. In the second position, the force application member is closer to the cold plate (as compared to the first position) and the spring fingers are compressed by contact with the cold plate, whereas in the first position, the force application member is farther from the cold plate and the spring fingers are less compressed (as compared to the second position) or are not compressed at all. Thus, a greater biasing force is generated in the second position than in the first position.

In one or more examples, the lever is connected to the mounting element and the force application member and configured to cause movement of the force application member between the second and first positions in response to the lever being shifted between the actuated state and the unactuated state.

In some cases, as the lever is shifted from the unactuated state to the actuated state, the lever moves the force application member along a first direction and simultaneously the mounting element moves the force application member (via engagement with a plurality of engagement members) along a second direction perpendicular to the first direction, such that the force application member is moved to the second position. More specifically, the lever applies a force urging motion along the first direction and this is translated by the mounting element into motion of the force application member along a diagonal direction which has one directional component along the first direction and another directional component along the second direction. This results in the force application member being moved to the second position. The engagement members may include sloped (ramped) surfaces which are sloped relative to the first direction, and which engage with complementary sloped surfaces of the force application member to cause the motion along the diagonal direction via the sloped surfaces sliding along one another. In some examples, the complementary sloped surfaces of the force application member may be formed by portions of the spring fingers. Thus, in some examples, in a state of the of the removable electronic module received in the receptacle, the lever in the actuated state, and the force application member in the second position: the plurality of spring fingers is compressed and apply spring force (e.g., from about 40 pound force to about 60 pound force) to the cold plate urging the cold plate against the removable electronic module to establish a thermal contact between the cold plate and the removable electronic module.

In some examples, as the lever is shifted from the actuated state to the unactuated state, the lever moves the force application member along a third direction, opposite to the first direction, and simultaneously the plurality of engagement members allows the force application member to be moved by the plurality of spring fingers along a fourth direction opposite to the second direction, such that the force application member is moved to the first position. More specifically, the force application member moves along another diagonal direction which has the third and fourth directions as directional components thereof. In such examples, in the state of the removable electronic module received in the receptacle, the lever in the unactuated state, and the force application member in the first position: the plurality of spring fingers is less compressed than in the second state (in some cases, fully decompressed) and thus apply little or no spring forces that press the cold plate against the removable electronic module.

In some examples, the removable electronic module may further include a mechanical switch which may be communicatively coupled to a controller of the electronic device. In such examples, when the lever is moved to the actuated state, the lever may push the mechanical switch to a closed position so as to communicate a first signal to the controller to indicate that the cooling module is engaged to the removable electronic module. Similarly, when the lever is moved to the unactuated state, the lever may allow the mechanical switch to move back to an open position from the closed position so as to communicate a second signal to the controller, to indicate that the cooling module is disengaged from the removable electronic module.

Since, the cooling module is configured to be decompressed when the removable electronic module is removably disposed into and out of the electronic device, the cooling module does not interfere with (or interrupt) a movement of the removable electronic module into and out of the electronic device. Accordingly, the removable electronic module may be easily connected to and disconnected from the electronic device, thereby preventing repetitive force (e.g., insertion force or removal force) related damage. Further, the spring fingers may apply and maintain an adequate contact force on the cold plate to establish a thermal contact (i.e., dry contact) between the cold plate and the removable electronic module. In other words, the spring fingers may be compressed to generate an optimal force to allow the cold plate to contact the removable electronic module and maintain thermal communication between such components. Since the spring fingers is configured to apply force to establish the thermal contact between the removable electronic module and the cold plate, the need for a TIM to establish the thermal interface (as per a conventional electronic device) between the interfacing surfaces may be avoided. Further, since a mechanical switch is used to determine a physical condition of the cooling module (i.e., actuated condition or unactuated condition) to remove heat from the removable electronic module and communicate to a controller of the electronic device, the controller can inform the user and prevent overheating problems of the removable electronic module.

FIG. 1 depicts a block diagram of an electronic device 2100. It should be understood that FIG. 1 is not intended to illustrate specific shapes, dimensions, or other structural details accurately or to scale, and that implementations of the electronic device 2100 may have different numbers and arrangements of the illustrated components and may also include other parts that are not illustrated. In some examples, the electronic device 2100 may be a computer (e.g., a server, a storage device), a networking device (e.g., a switch), or the like. In the example of FIG. 1, the electronic device 2100 is a server. In some examples, the electronic device 2100 includes a support structure 2102, a cooling module 2104, and a removable electronic module 2106.

The support structure 2102 includes one or more mechanical brackets that may be configured to support the cooling module 2104. In some examples, the support structure 2102 may define a receptacle 2108 of the electronic device 2100. In the example of FIG. 1, the receptacle 2108 extends between a first end 2101 of the support structure 2102 and a second end 2103 of the support structure 2102.

The cooling module 2104 is mounted to the support structure 2102 at the receptacle 2108. The cooling module 2104 may include one or more cooling components that may be configured to remove heat from the removable electronic module 2106. In one or more examples, the cooling module 2104 is movable between a first position and a second position relative to the support structure 2102. It may be noted that the first position may correlate to state in which little (or no) contact pressure is created between the cooling module 2104 and the removable electronic module 2106 and the second position may correlate to a position in which relatively high contact pressure is created between the cooling module 2104 and the removable electronic module 2106. More specifically, in some examples, the cooling module 2104 may be spaced a distance "$D_1$" apart from the removable electronic module 2106 while in the first position, as illustrated in FIG. 1, resulting in no contact pressure. In other examples, the cooling module 2104 may rest relatively lightly against the removable electronic module 2106 (e.g., due to gravity) when in the first position, resulting in relatively little contact pressure. In contrast, in the second position a spring force (described below) presses the cooling module 2104 against the removable electronic module 2106 and generates a relatively large contact pressure. In some examples, the cooling module 2104 includes components such as a mounting element 2110 and other components such as a cold plate 2112, a force application member 2114, and a lever 2182.

The mounting element 2110 provides support to the other components of the cooling module 2104 and is coupled to the support structure 2102 to mount the other components of the cooling module 2104 to the support structure 2102 at the receptacle 2108. In some examples, the mounting element 2110 includes a plurality of engagement members 2118 which may be configured to guide the movement of the force application member 2114 relative to the mounting element 2110 or the support structure 2102.

The cold plate 2112 is the part of the cooling module 2104 that contacts the removable electronic module 2106 and removes heat therefrom. The cold plate 2112 may include an interfacing element (e.g., a flat metal plate) that contacts the removable electronic module 2106 and a cooling conduit (not shown) in thermal contact with the interfacing element and configured to have cool fluid flow therethrough to remove heat from the interfacing element and hence from the removable electronic module 2106 in contact therewith. The cold plate 2112 is movably coupled to the mounting element 2110, e.g., via one or more supporting arms 2120. The supporting arms 2120 are configured to allow the cold plate 2112 to move toward or away from the removable electronic module 2106 (e.g., up, or down in FIG. 1).

In some examples, the supporting arms 2120, or some other element (not illustrated), may apply a force to the cold plate 2112 urging the cold plate 2112 upwards, such that when the cooling module 2104 is in the first position and the cold plate 2112 is not pressed downward against the removable electronic module 2106, the cold plate 2112 is suspended the distance "$D_1$" above the removable electronic module 2106. For example, a spring, counterbalance, or mechanical linkage may apply this upward force to the cold plate 2112. This spacing may allow for insertion or removal of the removable electronic module 2106 without any sliding contact being made with the cold plate 2112 and thus with no increased frictional forces due to the cooling module 2104. However, when the removable electronic module 2106 is installed and the cooling module 2104 is in the second position, a downward force is applied to the cold plate 2112 which is greater than the upward force, and thus the cold plate 2112 is moved downward into contact with the removable electronic module 2106, generating a relatively large contact pressure which establishes good thermal contact.

In some other examples, there is no upward force applied to the cold plate 2112, and thus when the cooling module 2104 is in the first position, gravity may hold the cold plate 2112 downward in a position where it may contact and rest against the removable electronic module 2106. However, the weight of the cold plate 2112 may be relatively light, and thus while the cold plate 2112 may rub against the removable electronic module 2106 during insertion or removal, the amount of friction generated by this contact may be relatively small. Similar to the other examples, when the removable electronic module 2106 is installed and the cooling module 2104 is in the second position, a downward force is applied to the cold plate 2112 generating a relatively large contact pressure which establishes good thermal contact.

Regardless of whether the cold plate 2112 is elevated above or rests against the removable electronic module 2106 while in the first position, in both cases the motion of the cold plate 2112 and the amount of contact pressure applied by the cold plate 2112 to the removable electronic module 2106 is controlled by the force application member 2114. The force application member 2114 is disposed between the mounting element 2110 and the cold plate 2112. Further, the force application member 2114 may be movable relative to the mounting element 2110 between the second position and the first position to change the downward force that is applied to the cold plate 2112 and thereby control its movement and the contact pressure. Specifically, the force application member 2114, when moved to the second position, may push strongly downward against the cold plate 2112 and thereby urge the cold plate 2112 to move into contact with and/or generate a large contact pressure with the removable electronic module 2106. Conversely, when the force application member 2114 is moved to the first position, the force application member 2114 may cease to press downward against the cold plate 2112, and thus the cold plate 2112 may be allowed to move upward to an elevated position above, or to rest against, the removable electronic module 2106 without a large contact pressure therebetween.

For example, the force application member 2114 may include a plurality of spring fingers 2122. This spring fingers 2122 are configured to be compressed against the cold plate 2112 when the force application member 2114 is moved to the second position, thereby applying downward spring forces to the cold plate 2112 which urge it against the removable electronic module 2016. In contrast, when the force application member 2114 is moved to the second position, the spring fingers 2122 are partially or fully decompressed, resulting in the downward spring forces applied to the cold plate 2112 being eliminated or reduced.

In some examples, the plurality of spring fingers 2122 may be engaged with the plurality of engagement members 2118 of the mounting element 2110 as the force application member 2114 is moved to the second position to guide the movement of the force application member 2114 and translate each spring finger 2122 to be compressed. Similarly, the plurality of spring fingers 2122 may be disengaged from the plurality of engagement members 2118 of the mounting element 2110 as the force application member 2114 is moved to the first position to guide the movement of the force application member 2114 and translate each spring finger 2122 to be decompressed. In the example of FIG. 1, the force application member 2114 is in the first position.

The lever 2182 is connected to the mounting element 2110 and the force application member 2114. The lever 2182 is actuated to move the force application member 2114 relative to the mounting element 2110. In one or more examples, the lever 2182 may be actuated to shift between an actuated state and an unactuated state. In the example of FIG. 1, the lever 2182 is in the unactuated state.

The removable electronic module 2106 such as a power supply unit, a small form-factor removable (SFP) transceiver, a non-volatile memory express (NVMe) storage may be slidably disposed in the receptacle 2108 of the electronic device 2100 and electrically connect with at least one electronic component such as a primary circuit board (not shown) of the electronic device 2100. In the example of FIG. 1, the cold plate 2112 of the cooling module 2104 is positioned above the removable electronic module 2106 such that the distance "$D_1$" is maintained between the removable electronic module 2106 and the cold plate 2112. Since the cold plate 2112 is maintained at the distance "$D_1$" from the removable electronic module 2106, the removable electronic module 2106 may be easily inserted into and removed from the receptacle 2108, thus making it easier to connect or and disconnect from the removable electronic module 2106 to or from the electronic device 2100, thereby preventing repetitive force related damage. In other examples, the cold plate 2112 may rest lightly against the removable electronic module 2106 as it is inserted or removed from the receptacle 2108, but because the contact pressure is relatively low the removable electronic module 2106 may still be relatively easy to insert or remove.

In one or more examples, the lever 2182 may be actuated (e.g., pushed along a first direction 10 to shift the lever 2182 from the unactuated state to the actuated state and move the force application member 2114 from the first position to the second position. In particular, when the lever 2182 is pushed along the first direction 10, the force application member 2114 is also pushed along the first direction 10. In such examples, in response to such movement of the force application member 2114 along the first direction 10, the plurality of engagement members 2118 may engage with the plurality of spring fingers 2122 and cause the force application member 2114 to simultaneously move along a second direction 20 perpendicular to the first direction 10, thereby moving the force application member 2114 to the second position from the first position. In one or more examples, when the force application member 2114 is in the second position, the plurality of spring fingers 2122 may be compressed by the plurality of engagement members 2118 to apply spring forces to the cold plate 2112 urging the cold plate 2112 against the removable electronic module 2106 to establish the thermal contact with the removable electronic module 2106. Since the spring fingers 2122 applies spring force on the cold plate 2112 to contact the removable electronic module 2106 and establish the thermal contact with the removable electronic module 2106, the need for a TIM to establish the thermal contact between the cold plate 2112 and the removable electronic module 2106 may be avoided.

In one or more examples, the lever 2182 may be actuated (e.g., pulled along a third direction 30 opposite to the first direction 10) to shift the lever 2182 from the actuated state to the unactuated state and move the force application member from the second position to the first position. In particular, when the lever 2182 is pulled along the third direction 30, the force application member 2114 is also pulled along the third direction 30. In such examples, in response to the movement the force application member 2114 along the third direction 30, the plurality of engagement members 2118 may disengage from the plurality of spring fingers 2122 and cause the force application member 2114 to be simultaneously moved by the plurality of spring fingers 2122 along a fourth direction 40 opposite to the second direction 20, thereby moving the force application member 2114 back to the first position from the second position. In one or more examples, when the force application member 2114 is in the first position, the plurality of spring fingers 2122 may be substantially decompressed and do not apply spring forces that press the cold plate 2112 against the removable electronic module 2106. A specific example of the cooling module 2104 and steps involved to move the force application member 2114 of the cooling module 2104 between the first position and second position are discussed in greater detail below.

Referring to the Figures, FIG. 2A depicts an exploded perspective view of a cooling module 104. The cooling module 104 is one example configuration of the cooling module 2104 described above. The cooling module 104 may include some components which are specific examples of the components of the cooling module 2104 already described above, and these corresponding components are given similar reference numbers having the same last two digits, such as 2112 and 212. Although the cooling module 104 is one example of the cooling module 2104, the cooling module 2104 is not limited to the cooling module 104. FIG. 2B depicts an assembled perspective view of the support structure 102 and the cooling module 104 of FIG. 2A. In the description hereinafter, FIGS. 2A-2B are described concurrently for ease of illustration.

As discussed herein, the support structure 102 includes a set of brackets 124 which may provide support to the cooling module 104. Referring to Figures, FIG. 3 depicts an enlarged perspective view of the set of brackets 124 of the support structure 102. The set of brackets 124 are disposed spaced apart from each other by a distance which may correspond to a width of the removable electronic module 106 and/or a width of the cooling module 104. Similarly, each bracket of the set of brackets 124 may have a height which may correspond to an accumulated height of the cooling module 104 and the removable electronic module 106. Further, each bracket of the set of brackets 124 are disposed facing one another to define a receptacle 108 therebetween which may be configured to house the cooling module 104 and the removable electronic module 106. The receptacle 108 extends from a first end 101 to a second end 103 of the support structure 102. In some examples, each bracket of the set of brackets 124 has a "U" shaped profile. Further each bracket 124 has a top flange 128, a bottom flange 132, and an intermediate body 126, where the top flange 128 extends from a first peripheral end portion 130 of the intermediate body 126 and the bottom flange 132 extends from a second peripheral end portion 134 of the intermediate body 126. In some examples, the top flange 128 and the bottom flange 132 of a first bracket 124A of the set of brackets 124 extend along a fifth direction 50. Similarly, the top flange 128 and the bottom flange 132 of a second bracket 124B of the set of brackets 124 extends along a sixth direction 60 opposite to the fifth direction 50. Further, the top flange 128 of each of the first bracket 124A and the second bracket 124B includes a plurality of first holes 136A and the bottom flange 132 of each of the first bracket 124A and the second bracket 124B includes a plurality of second holes 136B. In some examples, a plurality of first fasteners 137 may be actuated into the plurality of first holes 136A and a plurality of third holes 136C (see, FIGS. 4A-4B) to couple the set of brackets 124 of the support structure 102 to the mounting element 110, and thereby couple the cooling module 104 to the support structure 102. Similarly, a plurality of second fasteners (not shown) may be actuated into the plurality of second holes 136B to allow the support structure 102 to be coupled to the casing 1000 (see, FIG. 10) of an electronic device 1100 (see, FIGS. 11A-11B and 12A-12B). In some examples, the first direction 10 and the third direction 30 may correspond to a longitudinal direction of the electronic device 1100. The second direction 20 and the fourth direction 40 may correspond to a radial direction of the electronic device 1100. Further, the fifth direction 50 and the sixth direction 60 may correspond to lateral direction of the electronic device 1100.

Referring back to FIGS. 2A-2B, the cooling module 104 includes a mounting element 110, a cold plate 112, a force application member 114, and a lever 182. The cooling module 104 is disposed at the receptacle 108 of the support structure 102 and coupled to the top flange 128 of the support structure 102. The cooling module 104 may move relative to the support structure 102 and configured to contact with or distance from the removable electronic module 106 for establishing thermal contact with or maintaining substantial distance "$D_1$" from, respectively, the removable electronic module 106.

Referring to Figures, FIG. 4A depicts an enlarged perspective top view of the mounting element 110 and FIG. 4B depicts an enlarged perspective bottom view of the mounting element 110. In the description hereinafter, FIGS. 4A-4B are described concurrently for ease of illustration. The mounting element 110 includes a base 140, a set of flanges 142, a plurality of hooks 144, a plurality of third holes 136C, and a plurality of engagement members 118. The base 140 extends between a first end 109 and a second end 111 of the base 140 and includes an upper surface 140A and a bottom surface 140B. The base 140 may have a width which may correspond to the width of the force application member 114. A first flange 142A of the set of flanges 142 extends from a first peripheral end portion 148 of the base 140 and a second flange 142B of the set of flanges 142 extends from a second peripheral end portion 150 of the base 140. In particular, each flange among the first flange 142A and the second flange 142B extends along the fourth direction 40. In some examples, the base 140 and the set of flanges 142 may together provide a "U" shaped profile to the mounting element 110. The plurality of hooks 144 are disposed spaced apart from each other at a peripheral end portion of each flange of the first flange 142A and the second flange 142B. In some examples, the plurality of hooks 144 disposed in the first flange 142A extends along the fifth direction 50 and the plurality of hooks 144 disposed in the second flange 142B extends along the sixth direction 60. The plurality of hooks 144 may be configured to engage with the cold plate 112 to movable couple the cold plate 112 to the mounting element 110 and allow the cold plate 112 to move freely (during unactuated state of the lever 182) along the second direction 20 and the fourth direction 40. The plurality of third holes 136C are disposed spaced apart from each other on the base 140 along the first peripheral end portion 148 and the second peripheral end portion 150 of the base 140. The plurality of third holes 136C may be aligned to the plurality of first holes 136A of the set of brackets 124. In such examples, the first fastener 137 among the plurality of first fasteners may extend through the corresponding first hole 136A and the third hole 136C to couple the mounting element 110 to the support structure 102. The plurality of engagement members 118 are disposed spaced apart from each other and formed on the base 140. In some examples, each of the plurality of engagement members 118 may be formed by stamping the base 140. In some other examples, each of the plurality of engagement members 118 may be coupled to the bottom surface 140B of the base 140. In one or more examples, each of the plurality of engagement members 118 is an emboss having an angled body portion 146 protruding from the base 140 towards the force application member 114 at a first angle "a", which may be in a range from about 30 degrees to 60 degrees relative to the base 140. In one or more examples, the angled body portion 146 extends along the first direction 10.

Figure 5:
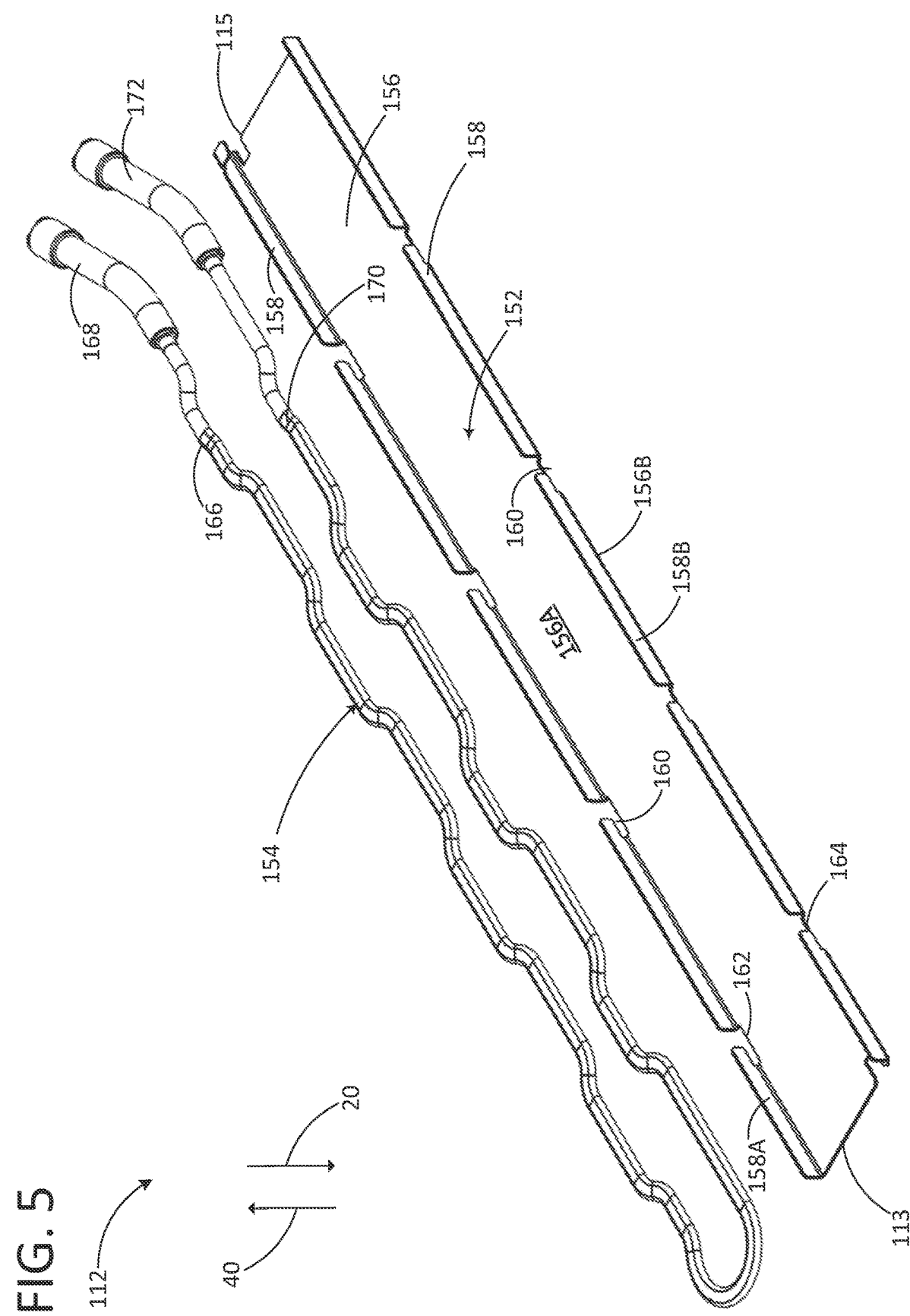
FIG. 5 illustrates an enlarged perspective view of a cold plate of the cooling module of FIGS. 2A-2B according to an example of the present disclosure.

Referring to Figures, FIG. 5 depicts an enlarged perspective view of the cold plate 112. FIG. 5 is an exploded view of the cold plate 112. In one or more examples, the cold plate 112 is configured to remove heat from the removable electronic module 106. In some examples, the cold plate 112 includes a first interfacing element 152 and a cooling conduit 154. The first interfacing element 152 includes a base 156, a set of flanges 158, and a plurality of notches 160. The base 156 extends between a first end 113 and a second end 115 of the base 156 and includes an upper surface 156A and a bottom surface 156B. The base 156 may have a width which may correspond to the width of the force application member 114. A first flange 158A of the set of flanges 158 extends from a first peripheral end portion 162 of the base 156 and a second flange 158B of the set of flanges 158 extends from a second peripheral end portion 164 of the base 156. In particular, each flange among the first flange 158A and the second flange 158B extends along the fourth direction 40 from the base 156. In some examples, the base 156 and the set of flanges 158 may together provide a "U" shaped profile to the first interfacing element 152 of the cold plate 112. The plurality of notches 160 are formed spaced apart from each other on each flange among the first flange 158A and the second flange 158B. Each notch 160 in the first flange 158A may be aligned to a corresponding notch 160 in the second flange 158B. In some examples, each notch among the plurality of notches 160 may have an "L" shaped profile. Further, the plurality of notches 160 may be aligned to the plurality of hooks 144 (see, FIGS. 4A-4B) of the mounting element 110. In some examples, when the mounting element 110 is disposed on the cold plate 112, the plurality of hooks 144 may slidably engage with the plurality of notches 160 to movable couple the first interfacing element 152 of the cold plate 112 to the base 140 of the mounting element 110 and allow the cold plate 112 to move freely (during unactuated state of the lever 182) along the second direction 20 and the fourth direction 40. The base 156 of the first interfacing element 152 may have a planar structure with high flatness/smoothness. In some examples, the base 156 may be made of thermally conductive materials such as aluminum, copper, or the like. The cooling conduit 154 may be disposed on and coupled to the upper surface 156A of the base 156. In some examples, the cooling conduit 154 includes an inlet 166 connected to an inlet hose 168 of a cooling mechanism (not shown), and an outlet 170 connected to an outlet hose 172 of the cooling mechanism. In the example of FIG. 5, the inlet hose 168 and the outlet hose 172 are disposed at the second end 115 of the cold plate 112. The cooling conduit 154 may have a circuitous path to increase the surface contact with the base 156 of the first interfacing element 152. The cooling conduit 154 may be made of thermally conductive materials such as aluminum, copper, or the like. The inlet hose 168 and the outlet hose 172 may be made of flexible material such as polymer, or the like. In one or more examples, the cooling conduit 154 may receive cool fluid (not shown) via the inlet 166 connected to the inlet hose 168. The cool fluid may be directed in the circuitous path defined by the cooling conduit 154 to remove heat from the first interfacing element 152 and generate hot fluid. Further, the cooling conduit 154 may direct the hot fluid from the cold plate 112 to the outlet hose 172 via the outlet 170. In other words, the cooling conduit 154 is configured to circulate the cool fluid between the inlet 166 and an outlet 170 of the cooling conduit 154 to remove the heat from the removable electronic module 106.

Referring to Figures, FIG. 6A depicts an enlarged perspective top view of the force application member 114 and FIG. 6B depicts an enlarged perspective bottom view of the force application member 114. In the description hereinafter, FIGS. 6A-6B are described concurrently for ease of illustration. The force application member 114 has a planar structure having a base 174, a plurality of openings 176, a fourth hole 136D, and a plurality of spring fingers 122. The base 174 extends between a first end 117 and a second end 119 of the force application member 114. The base 174 may have a width which may correspond to the width of the cold plate 112 and the mounting element 110. The plurality of openings 176 are formed on the base 174 and are disposed spaced apart from each other along the base 174. In some examples, each opening of the plurality of openings 176 may have a major length along the first direction 10. The plurality of spring fingers 122 are disposed spaced apart from each other on the base 140. In particular, one end 122A (or fixed end) of each spring finger of the plurality of spring fingers 122 extends from a rim 180 of one opening of the plurality of the openings 176. Further, another end 122B (or free end) of each spring finger of the plurality of spring fingers 122 bends towards the cold plate 112 at a second angle "B", which may be in a range from about 30 degrees to 60 degrees relative to the base 174. Further, each of the plurality of spring fingers 122 extends along the first direction 10. In one or more examples, when the lever 182 is in the unactuated state and the force application member 114 is in the second position, the first angle "a" and the second angle "B" may be substantially equal.

Referring to Figures, FIG. 7A depicts an enlarged exploded perspective view of the lever assembly 116 and FIG. 7B depicts an enlarged assembled perspective view of the lever 182. In some examples, the lever assembly 116 includes a lever 182 and a mechanical linkage 184. The lever 182 is a driver component having a handle 186 and a face plate 188 extending from the handle 186. The face plate 188 includes a fifth hole 136E and a sixth hole 136F spaced apart from each other. In some examples, the lever 182 is configured to be disposed below the first flange 142A of the mounting element 110 at the first end 109 such that the fifth hole 136E is aligned to one of the third hole among the plurality of third holes 136C. In such examples, a third fastener 139 (see, FIGS. 2A-2B) may extend through the one of the third hole 136C and the fifth hole 136E to pivotably connect the lever 182 to the mounting element 110, and thereby allow shifting of the lever 182 between the actuated state and the unactuated state. The mechanical linkage 184 may be transmission component configured to drive the motion of the lever 182 to the force application member 114. In some examples, the mechanical linkage 184 includes a seventh hole 136G and an eight hole 136H. The mechanical linkage 184 is used to connect the lever 182 to the force application member 114. In particular, a portion of the mechanical linkage 184 is disposed below the face plate 188 of the lever 182 such that the sixth hole 136F of the mechanical linkage 184 is aligned with the seventh hole 136G of the lever 182. In such examples, a fourth fastener 141 (see, FIGS. 2A-2B) may extend through the sixth hole 136F and the seventh hole 136G to connect the mechanical linkage 184 to the lever 182. Further, another portion of the mechanical linkage 184 may be disposed below the force application member 114 at the first end 117 of the force application member 114 such that the eight hole 136H is aligned with the fourth hole 136D of the force application member 114. In such examples, a fifth fastener (not shown) may extend through the eighth hole 136H and the fourth hole 136D to further connect the mechanical linkage 184 to the force application member 114. In one or more examples, the lever assembly 116 may be pushed along the first direction 10 and pulled along the third direction 30 to shift the lever 182 between the actuated state and the unactuated state, respectively.

Referring back to FIGS. 2A-2B, the mounting element 110 is disposed at the receptacle 108 of the support structure 102 such that the plurality of first holes 136A in the set of brackets 124 is aligned to the plurality of third holes 136C in the mounting element 110. In such examples, the plurality of first fasteners 137 is inserted into the plurality of first hole 136A and the plurality of third holes 136C to couple the mounting element 110 to the support structure 102. As discussed herein, a portion of the mechanical linkage 184 is disposed below the lever 182 such that the sixth hole 136F of the lever 182 is aligned with the seventh hole 136G of the mechanical linkage 184. In such examples, the fourth fastener 141 is inserted into the sixth hole 136F and the seventh hole 136G to connect the mechanical linkage 184 to the lever 182. Further, another portion the mechanical linkage 184 is disposed below the force application member 114 such that the eight hole 136H in the mechanical linkage 184 is aligned to the fourth hole 136D of the force application member 114. In such examples, the fifth fastener (not shown) is inserted into the eight hole 136H in the mechanical linkage 184 and the fourth hole 136D in the force application member 114 to connect the mechanical linkage 184 of the lever assembly 116 to the force application member 114. Accordingly, the lever 182 is connected to the force application member 114 via the mechanical linkage 184. Further, the assembly of the lever 182, the mechanical linkage 184, and the force application member 114 is disposed in the receptacle 108 such that the force application member 114 is located below the mounting element 110 and the lever assembly 116 is located below the first flange 142A of the mounting element 110 at the first end 109 of the mounting element 110. In such examples, when the force application member 114 is located below the base 140 of the mounting element 110, the plurality of engagement members 118 of the mounting element 110 is disposed within the plurality of openings 176 of the force application member 114. Additionally, the base 174 of the force application member 114 contacts the base 140 of the mounting element 110. Similarly, when the lever assembly 116 is located below the first flange 142A of the mounting element 110 at the first end 109 of the mounting element 110, the sixth hole 136F is aligned to one of the third hole 136C in the mounting element 110. In such examples, the third fastener 139 is inserted into the one of the third hole 136C of the mounting element 110 and the fifth hole 136E of the lever 182 to pivotably connect the lever 182 to the mounting element 110. Further, the cold plate 112 is disposed below the force application member 114 and mounted to the mounting element 110 such that the set of flanges 142 of the mounting element 110 contacts the set of the flanges 158 of the cold plate 112 and the plurality of spring fingers 122 of the force application member 114 is disposed above the cold plate 112. In such examples the plurality of hooks 144 of the mounting element 110 is slidably engaged with the plurality of notches 160 of the cold plate 112 to movable couple the cold plate 112 to the mounting element 110. In the example of FIG. 2B, the lever 182 is positioned in the unactuated state. In one or more examples, when the lever 182 is in the unactuated state, the lever 182 holds the force application member 114 in the first position so as to allow the plurality of spring fingers 122 to be substantially decompressed and do not apply spring forces that press the cold plate 112. Accordingly, in such examples, the cold plate 112 may freely move along the second direction 20 and the fourth direction 40, thereby allowing the removable electronic module 106 to be easily disposed in the receptacle 108 of the support structure 102.

Figure 8:
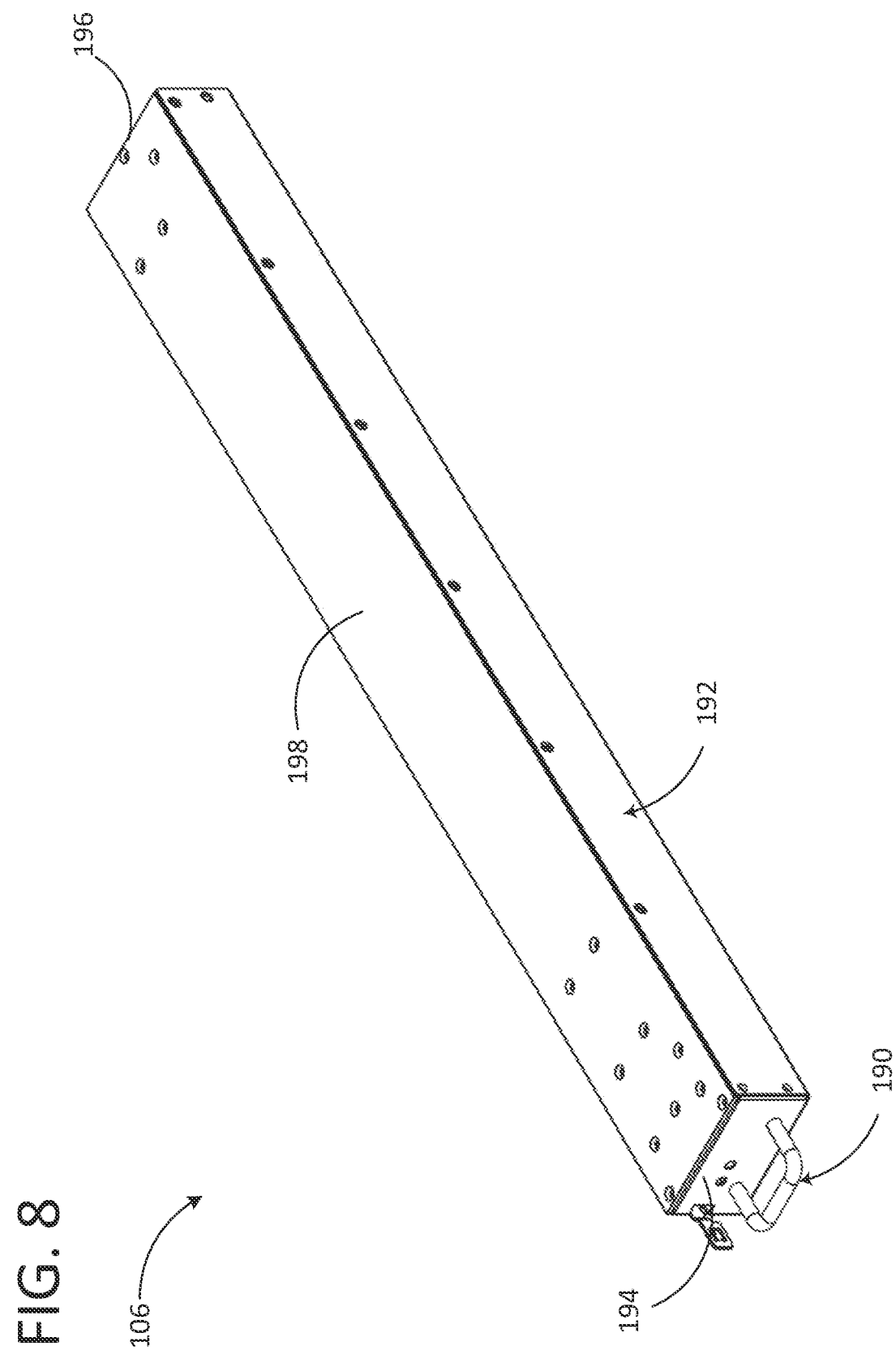
FIG. 8 illustrates a perspective view of a removable electronic module according to an example of the present disclosure.

FIG. 8 depicts a perspective view of a removable electronic module 106. The removable electronic module 106 may be a power supply unit, a small form-factor removable (SFP) transceiver, a non-volatile memory express (NVMe) storage, or the like. In the example of FIG. 8, the removable electronic module 106 is the power supply unit. The removable electronic module 106 includes a handle 190, an enclosure body 192, and a connector (not shown). The handle 190 is connected to a first end 194 of the enclosure body 192 and the connector is connected to a second end 196 of the enclosure body 192. Further the enclosure body 192 has an internal volume (not shown) having a plurality of electronic elements (not shown) connected to the connector and a second interfacing element 198 (e.g., a heat sink) disposed at an upper surface (not labeled) of the enclosure body 192. The second interfacing element 198 may have a planar structure with high flatness/smoothness. In some examples, the second interfacing element 198 may be made of thermally conductive materials such as aluminum, copper, or the like. The second interfacing element 198 may be disposed in thermal contact with the plurality of electronic elements of the removable electronic module 106 and configured to remove heat from the plurality of electronic elements. In one or more examples, the handle 190 may be used to slidably dispose the enclosure body 192 of the removable electronic module 106 into the receptacle 108 of the support structure 102.

Figure 9:
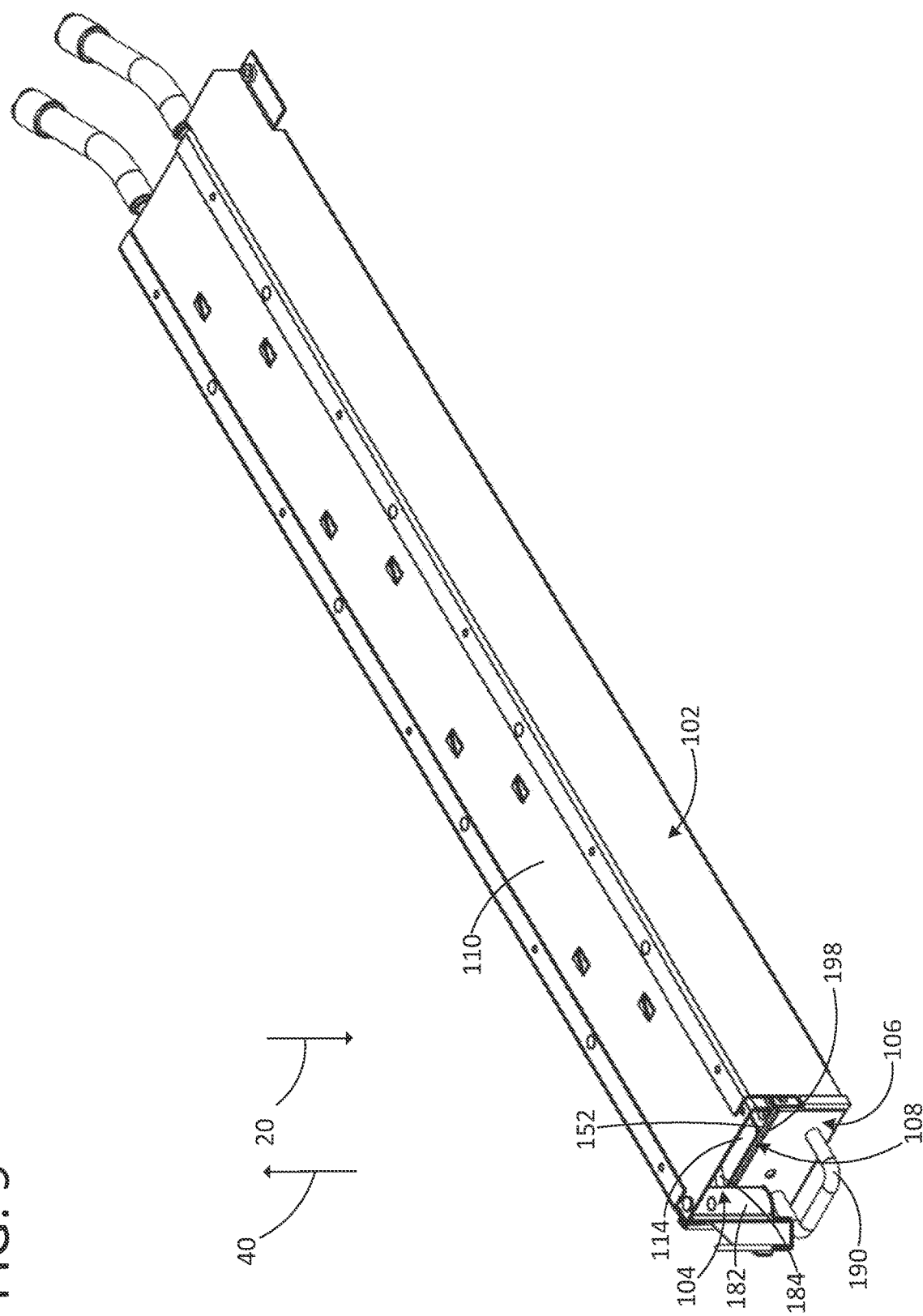
FIG. 9 illustrates a perspective view of the removable electronic module of FIG. 8 disposed in an assembly of the cooling module and the support structure of FIG. 2B according to an example of the present disclosure.

FIG. 9 depicts a perspective view of a removable electronic module 106 of FIG. 8 disposed in an assembly of the cooling module 104 and the support structure 102 of FIG. 2B. In one or more examples, the removable electronic module 106 may be disposed in the receptacle 108 of the support structure 102 when the lever 182 is in the unactuated state and the force application member 114 is in a first position. In particular, when the lever 182 is in the unactuated state and the force application member 114 is in the first position, the cold plate 112 may move freely along the second direction 20 and the fourth direction 40. Accordingly, in such examples, when the removable electronic module 106 is disposed in the receptacle 108, the second interfacing element 198 of the removable electronic module 106 may be disposed facing the first interfacing element 152 of the cold plate 112 and such interfacing elements may maintain a substantial distance "D$_1$" therebetween. Thus, the removable electronic module 106 may be easily connected to and disconnected from the electronic device 1100, thereby preventing repetitive force related damage.

FIG. 10 depicts a perspective view of a casing 1000 of an electronic device 1100 (see, FIGS. 11A-11B and 12A-12B). The casing 1000 includes a bottom wall 1002 and a set of sidewalls 1004 extending perpendicularly from the bottom wall 1002. For example, each sidewall of the set of sidewalls 1004 extends along a fourth direction 40 from the bottom wall 1002. Each sidewall among the set of sidewalls 1004 includes a flange 1010 extending perpendicularly from the corresponding sidewall. For example, a first flange 1010A extends along a fifth direction 50 from a first sidewall 1004A among the set of sidewalls 1004. Similarly, a second flange 1010B extends along a sixth direction 60 from a second sidewall 1004B among the set of sidewalls 1004. Each of the first flange 1010A and the second flange 1010B includes a plurality of first casing holes 1036A. Further, the bottom wall 1002 includes a plurality of second casing holes 1036B disposed in multiple rows along a first direction 10 between a first end 1006 and a second end 1008 of the casing 1000. For example, the bottom wall 1002 includes a first row 1012A of the plurality of second casing holes 1036B, a second row 1012B of the plurality of second casing holes 1036B, a third row 1012C of the plurality of second casing holes 1036B, and a fourth row 1012D of the plurality of second casing holes 1036B. In the example of FIG. 10, the casing 1000 is configured to house three numbers of the support structures 102 holding three numbers of the cooling modules 104. For example, the plurality of first casing holes 1036A in the first sidewall 1004A and the plurality of second casing holes 1036B in the first row 1012A may be configured to support one of the support structures 102 (having only the second bracket 124B) holding the cooling module 104. Similarly, the plurality of second casing holes 1036B in the second row 1012B and the third row 1012C may be configured to another support structure 102 holding the cooling module 104. Further, the plurality of first casing holes 1036A in the second sidewall 1004B and the plurality of second casing holes 1036B in the fourth row 1012D may be configured to support one of the support structures 102 (having only the first bracket 124A) holding the cooling module 104.

FIG. 11A depicts a perspective view of an electronic device 1100 having the casing 1000 of FIG. 10 and the removable electronic module 106 of FIG. 9 disposed in an assembly of the support structure 102 and the cooling module 104 of FIG. 2B. FIG. 11B depicts a cross-sectional view of a portion of the electronic device 1100 of FIG. 11A taken along line 1-1'. In the description hereinafter, FIGS. 11A-11B are described concurrently for ease of illustration. In the example of FIGS. 11A-11B the lever 182 of the cooling module 104 is in an unactuated state and the cooling module 104 is in the first position. In the example of FIG. 11A, the support structure 102 holding the cooling module 104 is disposed in the casing 1000 such that the plurality of second holes 136B (see, FIG. 3) of the first bracket 124A, and the second row 1012B of the plurality of second casing holes 1036B (see FIG. 10) of the casing 1000 are aligned to each other, and the plurality of second holes 136B (see, FIG. 3) of the second bracket 124B, and the third row 1012C of the plurality of second casing holes 1036B (see FIG. 10) of the casing 1000 are aligned to each other. In such examples, a plurality of second fasteners (not shown) may extend through the plurality of second holes 136B in the first bracket 124A and the plurality of second casing holes 1036B in the second row 1012B to couple the first bracket 124A to the casing 1000. Similarly, another plurality of second fasteners (not shown) may extend through the plurality of second holes 136B in the second bracket 124B and the plurality of second casing holes 1036B in the third row 1012C to couple the second bracket 124B to the casing 1000. Accordingly, the support structure 102 holding the cooling module 104 is coupled to the casing 1000. Further, the removable electronic module 106 is slidably disposed in the receptacle 108 of the support structure by pushing the removable electronic module 106 along a first direction 10.

Referring to FIG. 11B, when the lever 182 is in the unactuated state, the force application member 114 of the cooling module 104 is in the first position. Further, the base 140 of the mounting element 110 is in contact with the base 174 of the force application member 114 and each of the plurality of engagement members 118 of the mounting element 110 is disposed in a corresponding opening of the plurality of openings 176 of the force application member 114. Additionally, the plurality of spring fingers 122 is substantially decompressed and does not apply spring forces that press the cold plate 112 against the removable electronic module 106. In particular, the angled body portion 146 of each of the plurality of engagement members 118 is protruded into the corresponding opening of the plurality of openings 176 to allow the plurality of spring fingers 122 to be decompressed and do not apply spring forces that press the cold plate 112 against the removable electronic module 106. Thus, the cold plate 112 maintains the substantial distance "$D_1$" with the removable electronic module 106. Further, the cold plate 112 may freely move along the second direction 20 and the fourth direction 40, thereby allowing the removable electronic module 106 to be easily disposed in the receptacle 108 of the support structure 102.

Figure 12A:
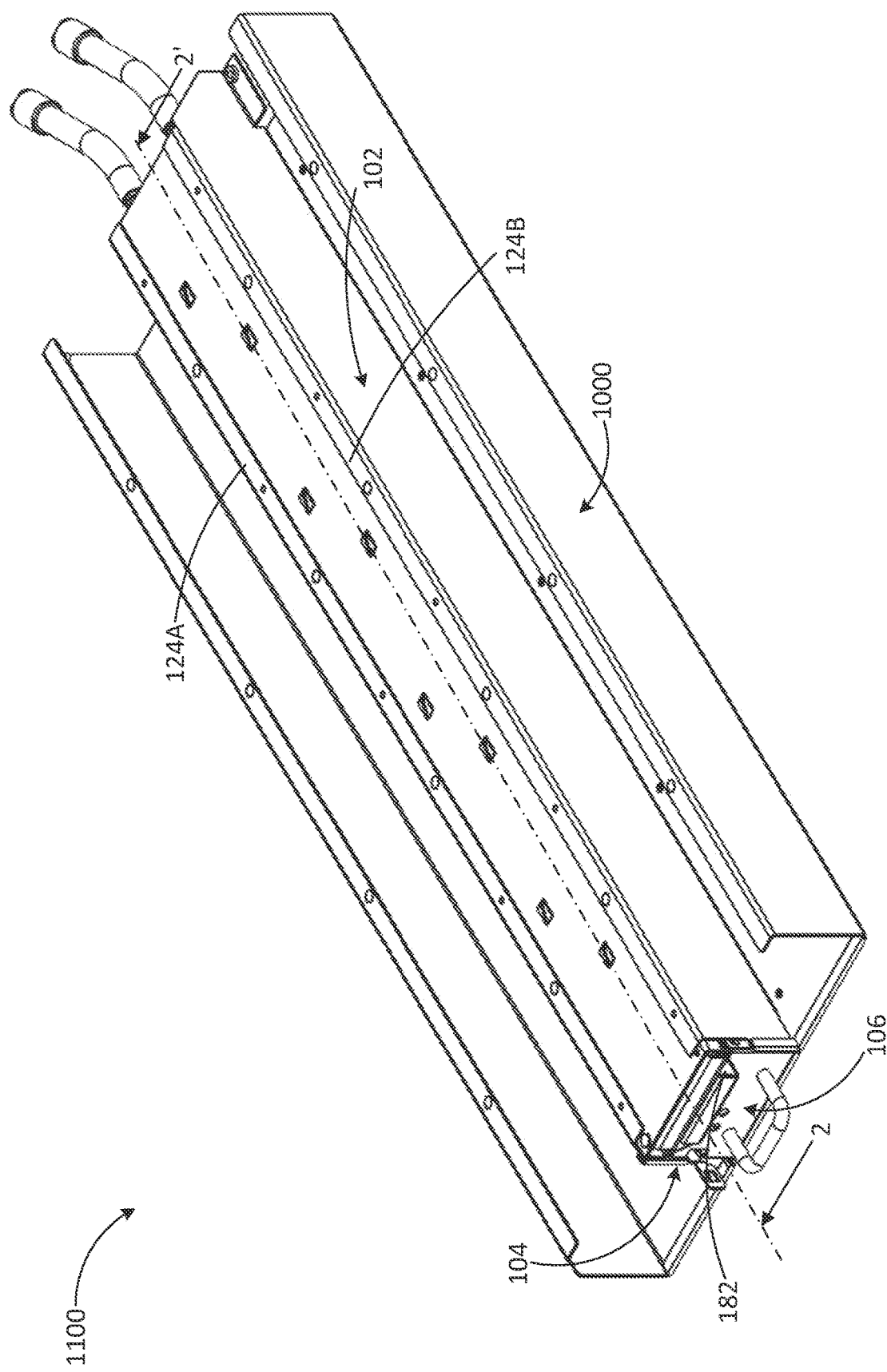
FIG. 12A illustrates a perspective view of an electronic device having the casing of FIG. 10 and removable electronic module of FIG. 8 disposed in an assembly of the cooling module in the support structure of FIG. 2B in an actuated state according to an example of the present disclosure.

FIG. 12A depicts a perspective view of an electronic device 1100 having the casing 1000 of FIG. 10 and the removable electronic module 106 of FIG. 9 disposed in an assembly of the support structure 102 and the cooling module 104 of FIG. 2B. FIG. 12B depicts a cross-sectional view of a portion of the electronic device 1100 of FIG. 12A taken along line 2-2'. In the description hereinafter, FIGS. 12A-12B are described concurrently for ease of illustration. In the example of FIGS. 12A-12B the lever 182 of the cooling module 104 is in an actuated state and the cooling module 104 is in the second position.

Referring to FIG. 12B, in particular, when the lever 182 is shifted from the unactuated state to the actuated state, the force application member 114 is moved from the first position to the second position. As the lever 182 is shifted from the unactuated state to the actuated state, the lever 182 moves the force application member 114 along a first direction 10. In response to the movement of the force application member 114 along the first direction 10, the plurality of engagement members 118 of the mounting element 110 moves the force application member 114 to move along a second direction 20 perpendicular to the first direction 10, such that the force application member 114 is moved to the second position. In particular, the lever 182 and the plurality of engagement members 118 are configured to move the force application member 114 from the first position to the second position in response to the lever 182 being shifted from the unactuated state to the actuated state. In some examples, in a transition state of the lever 182 from the unactuated state to the actuated state, a portion of each spring finger 122 slides along the angled body portion 146 of the corresponding engagement member 118 to allow translating each spring finger 122 to be compressed. In some examples, in the actuated state of the lever 182, the angled body portion 146 of each engagement member 118 is engaged with the base 140 of the force application member 114 to compress the plurality of spring fingers 122 and apply spring force that presses the cold plate 112 against the removable electronic module 106. Thus, each spring finger 122 applying spring forces to the cold plate 112 urges the cold plate 112 against the removable electronic module 106 to establish a thermal contact between the cold plate 112 and the removable electronic module 106. In some examples, the thermal contact is established between a dry thermal interface of the cold plate 112 and the removable electronic module 106. In other words, the interfacing surfaces of the cold plate 112 and the removable electronic module 106 may not require a thermal interface material (TIM) therebetween to establish the thermal contact. Accordingly, when the lever 182 is in the actuated state and the force application member 114 is in the second position, the cold plate 112 may not be able to maintain the substantial distance "$D_1$" with the removable electronic module 106 and may not be able to freely move along the second direction 20 and the fourth direction 40. Thus, the removable electronic module 106 cannot be easily removed from the receptacle 108 of the support structure 102. In some examples, when the cold plate 112 is in thermal contact with the removable electronic module 106, the second interfacing element 198 of the removable electronic module 106 may transfer the heat from the plurality of electronic elements of the removable electronic module 106 to the first interfacing element 152 of the cold plate 112. Further, the cooling conduit 154 disposed on the first interfacing element 152 is configured to circulate the cool fluid between the inlet 166 and the outlet 170 of the cooling conduit 154 to remove the heat transferred to the first interfacing element 152 of the cold plate 112.

However, the lever 182 may be shifted back from the actuated state to the unactuated state so as to move the force application member 114 from the second position to the first position, and thereby allow the removable electronic module 106 to be easily removed from the receptacle 108 of the support structure 102. In some examples, as the lever 182 is shifted from the actuated state to the unactuated state, the lever 182 moves the force application member 114 along a third direction 30, opposite to the first direction 10. In response to such movement of the force application member 114 along the third direction 30, the plurality of engagement members 118 of the mounting element 110 allows the force application member 114 to be moved by the plurality of spring fingers 122 along a fourth direction 40 opposite to the second direction 20, such that the force application member 114 is moved to the first position. In some examples, in a transition state of the lever 182 from the actuated state to the unactuated state, the portion of each spring finger 122 slides back along the angled body portion 146 to allow translating each spring finger to be decompressed. Thus, the removable electronic module 106 may be easily removed from the receptacle 108 of the support structure 102.

FIG. 13A depicts a perspective view of a portion of an electronic device 1300 having a controller 1335, a support structure 1302, a cooling module 1304, and a removable electronic module 1306 having a mechanical switch 1333 in an open position. The cooling module 1304 is one example configuration of the cooling module 2104 described above. FIG. 13B depicts a perspective view of the electronic device 1300 of FIG. 13A having the controller 1335, the support structure 1302, the cooling module 1304, and the removable electronic module 1306 having the mechanical switch 1333 a closed position.

The support structure 1302 and the cooling module 1304 are the same as that of a support structure 102 and a cooling module 104 (as shown in FIGS. 2A-2B). Therefore, the support structure 1302 and the cooling module 1304 are not discussed herein for the purpose of brevity of the description and such non-description of the support structure 1302 and the cooling module 1304 should not be construed as a limitation of the present disclosure. Further, the removable electronic module 1306 is substantially the same as that of a removable electronic module 106 (as shown in FIG. 8), except that the removable electronic module 106 includes a mechanical switch 1333 disposed on a second interfacing element 1398 and configured to communicatively couple to the controller 1335. The mechanical switch 1333 may be movable along a second direction 20 and a fourth direction 40. In some examples, the mechanical switch 1333 may be moved along the second direction 20 to switch to the closed position from the open position. Similarly, the mechanical switch 1333 may be moved along the fourth direction 40 to switch to the open position from the closed position. In one or more examples, the mechanical switch 1333 may be spring loaded and in the relaxed state the mechanical switch 1333 may be moved to the open position by one or more springs (not shown). In some examples, when the mechanical switch 1333 is in the closed position (as shown in FIG. 13B), the mechanical switch 1333 may be connected to the controller 1335 via a communication path 1337. However, when the mechanical switch 1333 is in the open position, the mechanical switch 1333 may be disconnected from the controller 1335. For example, a circuit connection (now shown) may be established by moving the mechanical switch 1333 to the closed position. Thus, the circuit may supply a signal 1339 to the controller 1335 via the communication path 1337. However, the circuit connection may be disconnected by the movement of the mechanical switch 1333 to the open position. Thus, the circuit may not supply the signal 1339 to the controller 1335 via the communication path 1337. In one or more examples, the controller 1335 receiving the signal 1339 may be indicative of the removable electronic module 1306 been slidably disposed in the receptacle 1308 of the support structure 1302. In other words, when the signal 1339 is communicated to the controller 1335, it is indicative of the cold plate 1312 being engaged to the removable electronic module 1306. Similarly, the controller 1335 not receiving the signal 1339 may be indicative of the removable electronic module 1306 not being disposed in the receptacle 1308 of the support structure 1302. In other words, when there is no communication of the signal 1339 to the controller 1335, it is indicative of the cold plate 1312 being disengaged from the removable electronic module 1306.

In some examples, when a lever 1382 is switched to the actuated state to move the cooling module 1304 to a second position from a first position, the lever 1382 contacts the mechanical switch 1333 and moves the mechanical switch 1333 to the closed position (see, FIG. 13B) so as to allow the circuit to communicate the signal 1339 to the controller 1335. In such examples, the signal 1339 is indicative of a first interfacing element 1356 of a cold plate 1312 being engaged to the second interfacing element 1398 of the removable electronic module 1306.

In some examples, when the lever 1382 is switched to the unactuated state to move the cooling module 1304 to the first position from the second position, the lever 1382 moves away from the mechanical switch 1333 so as to allow the mechanical switch 1333 to move back to an open position (see, FIG. 13A) so as to prevent the circuit to communicate the signal to the controller 1335. In such examples, no communication of the signal to the controller 1335 is indicative of the first interfacing element 1356 of the cold plate 1312 being disengaged from the second interfacing element 1398 of the removable electronic module 1306.

Accordingly, in one or more examples, the mechanical switch 1333 determines physical conditions of the cooling module 1304 (i.e., first position or second position), and the controller 1335 may further indicate a user such physical conditions of the cooling module 1304. Accordingly, the mechanical switch may prevent overheating problems associated with the removable electronic module 1306 being not engaged with the cooling module 1304 to remove heat from the removable electronic module 1306.

FIG. 14 depicts a flowchart depicting a method 1400 of establishing thermal connection between a cooling module and a removable electronic module of an electronic device. It may be noted herein that the method 1400 is described in conjunction with FIGS. 1, 2A-2B, 3, 4A-4B, 5, 6A-6B, 7A-7B, 8-10, 11A-11B, and 12A-12B for example. The method 1400 starts at block 1402 and continues to block 1404.

At block 1404, the method 1400 includes disposing a removable electronic module in a receptacle of an electronic device including a cooling module mounted to a support structure of the electronic device, at the receptacle. The method 1400 continues to block 1406. The method 1400 continues to block 1406.

At block 1406, the method 1400 includes shifting a lever connected to a mounting element and a force application member of the cooling module, from an unactuated position to an actuated position such that: i) the lever moves the force application member along a first direction, ii) a plurality of engagement members of the mounting element moves the force application member along a second direction perpendicular to the first direction in response to movement of the force application member along the first direction, such that the force application member moves to a first position, and iii) a plurality of spring fingers of the force application member is compressed in response to the movement of the force application member along the second direction and apply spring force to a cold plate of the cooling module, which is movably coupled to the mounting element, urging the cold plate against the removable electronic module to establish a thermal contact between the cold plate and the removable electronic module. The method 1400 continues to block 1408.

At block 1408, the method 1400 further includes shifting the lever from the actuated position to the unactuated position such that: 1) the lever moves the force application member along a third direction, opposite to the first direction, ii) the plurality of engagement members allows the force application member to be moved by the plurality of spring fingers along a fourth direction opposite to the second direction in response to the movement of the force application member along the third direction, such that the force application member moves to a second position, and iii) the plurality of spring fingers remains substantially decompressed in response to the movement of the force application member along the fourth direction and do not apply spring forces that press the cold plate against the removable electronic module.

In some examples, the method 1400 further includes moving a mechanical switch to a closed position by the lever, as the lever is shifted to the actuated position, to communicate a signal to a controller of the electronic device, where the signal is indicative of the cold plate being engaged to the removable electronic module. Further, the method 1400 includes moving the mechanical switch to an open position by the lever, as the lever is shifted to the unactuated position, to not communicate the signal to the controller, where no communication of the signal is indicative of the cold plate being disengaged from the removable electronic module. The method 1400 ends at block 1410.

Since, the cooling module is configured to be decompressed when the removable electronic module is removably disposed into and out of the electronic device, the cooling module does not interfere (or interrupt) with a movement of the removable electronic module into and out of the electronic device. Accordingly, the removable electronic module may be easily connected to and disconnected from the electronic device, thereby preventing repetitive force (e.g., insertion force or removal force) related damage. Further, the spring fingers may apply and maintain an adequate contact force on the cold plate to establish a thermal contact (i.e., dry contact) between the cold plate and the removable electronic module. In other words, the spring fingers may be compressed to generate an optimal force to allow the cold plate to contact the removable electronic module and maintain thermal communication between such components. Since the spring fingers is configured to apply force to establish the thermal contact between the removable electronic module and the cold plate, the need for a TIM to establish the thermal interface (as per a conventional electronic device) between the interfacing surfaces may be avoided. Further, since a mechanical switch is used to determine a physical condition of the cooling module (i.e., first position or second position) to remove heat from the removable electronic module and communicate to a controller of the electronic device, the controller can inform the user and prevent overheating problems of the removable electronic module.

In the foregoing description, numerous details are set forth to provide an understanding of the subject matter disclosed herein. However, implementation may be practiced without some or all of these details. Other implementations may include modifications, combinations, and variations from the details discussed above. It is intended that the following claims cover such modifications and variations.

What is claimed is:

1. A cooling module comprising:
a mounting element configured to be coupled to a support structure of an electronic device to mount the cooling module to the support structure at a receptacle of the electronic device configured to removably receive a removable electronic module in the receptacle, the mounting element comprising a plurality of engagement members;
a cold plate movably coupled to the mounting element;
a force application member comprising a plurality of spring fingers, disposed between the mounting element and the cold plate, and movable relative to the mounting element; and
a lever connected to the mounting element and the force application member, and configured to be shifted between an actuated state and an unactuated state,
wherein the lever and the plurality of engagement members are configured to move the force application member between a first position and a second position in response to the lever being shifted between the unactuated state and the actuated state,
wherein, as the lever is shifted from the unactuated state to the actuated state, the lever moves the force application member along a first direction and in response the plurality of engagement members moves the force application member to move along a second direction perpendicular to the first direction, such that the force application member is moved to the second position,
wherein, in a state of the removable electronic module received in the receptacle, the lever in the actuated state, and the force application member in the second position: the plurality of spring fingers is compressed and apply spring forces to the cold plate urging the cold plate against the removable electronic module to establish a thermal contact between the cold plate and the removable electronic module.

2. The cooling module of claim 1,
wherein, as the lever is shifted from the actuated state to the unactuated state, the lever moves the force application member along a third direction, opposite to the first direction, and in response the plurality of engagement members allows the force application member to be moved by the plurality of spring fingers along a fourth direction opposite to the second direction, such that the force application member is moved to the first position; and
wherein, in the state of the removable electronic module received in the receptacle, the lever in the unactuated state, and the force application member in the first position: the plurality of spring fingers is substantially decompressed and do not apply spring forces that press the cold plate against the removable electronic module.

3. The cooling module of claim 1, wherein a portion of the mounting element comprises an emboss to define each engagement member of the plurality of engagement members, and wherein the emboss has an angled body portion protruding towards the force application member.

4. The cooling module of claim 3, wherein the force application member comprises a base and a plurality of openings defined in the base, and wherein one end of each spring finger of the plurality of spring fingers extends from a rim of one opening of the plurality of the openings.

5. The cooling module of claim 4, wherein, in the unactuated state of the lever, the angled body portion is protruded into a corresponding opening of the plurality of openings to allow the plurality of spring fingers to be decompressed and do not apply spring forces that press the cold plate against the removable electronic module.

6. The cooling module of claim 4, wherein, in the actuated state of the lever, the angled body portion of each engagement member is engaged with the base of the force application member to compress the plurality of spring fingers and apply spring force that presses the cold plate against the removable electronic module.

7. The cooling module of claim 4, wherein, in a transition state of the lever between the actuated state and the unactuated state, a portion of each spring finger slides along the angled body portion to allow translating each spring finger to be compressed or decompressed.

8. The cooling module of claim 1, further comprising a mechanical linkage connecting the lever and the force application member to each other, and wherein the lever is further pivotably connected to the mounting element to allow shifting of the lever between the actuated state and the unactuated state.

9. The cooling module of claim 1, further comprising a cooling conduit disposed on the cold plate to establish the thermal contact with the removable electronic module via the cold plate, and wherein the cooling conduit is configured to circulate a cool fluid between an inlet and an outlet of the cooling conduit.

10. An electronic device comprising:
a support structure;
a cooling module mounted to the support structure at a receptacle of the electronic device, the cooling module comprising:
a mounting element coupled to the support structure to mount the cooling module to the support structure, comprising a plurality of engagement members;
a cold plate movably coupled to the mounting element;
a force application member comprising a plurality of spring fingers, disposed between the mounting element and the cold plate, and movable relative to the mounting element, and a lever connected to the mounting element and the force application member, and configured to be shifted between an actuated state and an unactuated state,
wherein the lever and the plurality of engagement members are configured to move the force application member between a first position and a second position in response to the lever being shifted between the unactuated state and the actuated state,
wherein, as the lever is shifted from the unactuated state to the actuated state, the lever moves the force application member along a first direction and in response the plurality of engagement members moves the force application member to move along a second direction perpendicular to the first direction, such that the force application member is moved to the second position; and
a removable electronic module removably received in the support structure such that the removable electronic module defines another portion of the receptacle,
wherein, in a state of the removable electronic module received in the receptacle, the lever in the actuated state, and the force application member in the second position: the plurality of spring fingers is compressed and apply spring forces to the cold plate urging the cold plate against the removable electronic module to establish a thermal contact between the cold plate and the removable electronic module.

11. The electronic device of claim 10,
wherein, as the lever is shifted from the actuated state to the unactuated state, the lever moves the force application member along a third direction, opposite to the first direction, and in response the plurality of engagement members allows the force application member to be moved by the plurality of spring fingers along a fourth direction opposite to the second direction, such that the force application member is moved to the first position; and
wherein, in the state of the removable electronic module received in the receptacle, the lever in the unactuated state, and the force application member in the first position: the plurality of spring fingers is substantially decompressed and do not apply spring forces that press the cold plate against the removable electronic module.

12. The electronic device of claim 10, wherein a portion of the mounting element comprises an emboss to define each engagement member of the plurality of engagement members, and wherein the emboss has an angled body portion protruding towards the force application member.

13. The electronic device of claim 12, wherein the force application member comprises a base and a plurality of openings defined in the base, and wherein one end of each spring finger of the plurality of spring fingers extends from a rim of one opening of the plurality of the openings.

14. The electronic device of claim 13,
wherein, in the unactuated state of the lever, the angled body portion is protruded into a corresponding opening of the plurality of openings to allow the plurality of spring fingers to be decompressed and do not apply spring forces that press the cold plate against the removable electronic module;
wherein, in the actuated state of the lever, the angled body portion of each engagement member is engaged with the base of the force application member to compress the plurality of spring fingers and apply spring force that presses the cold plate against the removable electronic module; and wherein, in a transition state of the lever between the actuated state and the unactuated state, a portion of each spring finger slides along the angled body portion to allow translating each spring finger to be compressed or decompressed.

15. The electronic device of claim 10, further comprising a mechanical linkage connecting the lever and the force application member to each other, and wherein the lever is further pivotably connected to the mounting element to allow shifting of the lever between the actuated state and the unactuated state.

16. The electronic device of claim 10, wherein the removable electronic module further comprises a mechanical switch configured to communicatively couple to a controller of the electronic device, wherein, in the actuated state of the lever, the mechanical switch is moved to a closed position to communicate a signal to the controller, where the signal is indicative of the cold plate being engaged to the removable electronic module, and wherein, in the unactuated state of the lever, the mechanical switch is moved to an open position to not communicate the signal to the controller, where no communication of the signal is indicative of the cold plate being disengaged from the removable electronic module.

17. The electronic device of claim 10, wherein the thermal contact is established between a dry thermal interface of the cold plate and the removable electronic module.

18. A method comprising:
disposing a removable electronic module in a receptacle of an electronic device comprising a cooling module mounted to a support structure of the electronic device, at the receptacle; and
shifting a lever connected to a mounting element and a force application member of the cooling module, from an unactuated position to an actuated position such that:
the lever moves the force application member along a first direction;
a plurality of engagement members of the mounting element moves the force application member along a second direction perpendicular to the first direction in response to movement of the force application member along the first direction, such that the force application member moves to a first position; and
a plurality of spring fingers of the force application member is compressed in response to the movement of the force application member along the second direction and apply spring force to a cold plate of the cooling module, which is movably coupled to the mounting element, urging the cold plate against the removable electronic module to establish a thermal contact between the cold plate and the removable electronic module.

19. The method of claim 18, further comprising shifting the lever from the actuated position to the unactuated position such that;
the lever moves the force application member along a third direction, opposite to the first direction;
the plurality of engagement members allows the force application member to be moved by the plurality of spring fingers along a fourth direction opposite to the second direction in response to the movement of the force application member along the third direction, such that the force application member moves to a second position; and
the plurality of spring fingers remains substantially decompressed in response to the movement of the force application member along the fourth direction and do not apply spring forces that press the cold plate against the removable electronic module.

20. The method of claim 18, further comprising:
moving a mechanical switch to a closed position by the lever, as the lever is shifted to the actuated position, to communicate a signal to a controller of the electronic device, where the signal is indicative of the cold plate being engaged to the removable electronic module, and
moving the mechanical switch to an open position by the lever, as the lever is shifted to the unactuated position, to not communicate the signal to the controller, where no communication of the signal is indicative of the cold plate being disengaged from the removable electronic module.

* * * * *